United States Patent [19]

Kamioka et al.

[11] Patent Number: 5,671,209
[45] Date of Patent: Sep. 23, 1997

[54] FOCUSING TIME PERIOD AND POWER CONTROL OF A MULTILASER DIODE ARRAY

[75] Inventors: Yuichi Kamioka, Takatsuki; Kenji Koishi, Sanda; Daisuke Ogata, Amagasaki; Shigeru Furumiya, Himeji, all of Japan

[73] Assignee: Matsushita Electric Industrial Co., Ltd., Kadoma, Japan

[21] Appl. No.: 559,432

[22] Filed: Nov. 15, 1995

[30] Foreign Application Priority Data

Nov. 17, 1994 [JP] Japan ................................ 6-283410

[51] Int. Cl.$^6$ .............................. G11B 7/09; G11B 7/125
[52] U.S. Cl. ................. 369/116; 369/112; 369/122; 369/44.14; 369/44.37
[58] Field of Search .......................... 369/112, 124, 369/116, 109, 121, 105, 122, 54, 44.37, 44.13, 44.26, 44.14

[56] References Cited

U.S. PATENT DOCUMENTS

| | | | |
|---|---|---|---|
| 4,811,348 | 3/1989 | Arimoto et al. | 372/29 |
| 4,825,064 | 4/1989 | Ando | 250/205 |
| 5,295,125 | 3/1994 | Oonishi et al. | 369/44.37 |
| 5,398,228 | 3/1995 | Maeda | 369/124 |
| 5,508,990 | 4/1996 | Nagasaki et al. | 369/60 |

FOREIGN PATENT DOCUMENTS

| | | |
|---|---|---|
| 0256827 | 8/1987 | European Pat. Off. . |
| 3804452 | 8/1988 | Germany . |
| 59-019252 | 1/1984 | Japan . |
| 3102656 | 4/1991 | Japan . |
| 3-102656 | 4/1991 | Japan . |
| 4153926 | 5/1992 | Japan . |

*Primary Examiner*—Georgia Y. Epps
*Assistant Examiner*—Kim-Kwok Chu
*Attorney, Agent, or Firm*—Renner, Otto, Boisselle & Sklar

[57] ABSTRACT

A method for controlling intensities of a plurality of laser beams respectively emitted on a track of an optical disk by a plurality of laser diodes according to the present invention includes a step of performing focusing servo control for focusing one of the plurality of laser beams emitted by one of the plurality of laser diodes onto the track, and concurrently controlling an intensity of the laser beam emitted by each of plurality of laser diodes to be within a predetermined range by comparing a signal which is in accordance with an intensity of the laser beam emitted by that laser beam with a reference signal. A period during which the one of the plurality of laser diodes used for the focusing does not emit the one laser beam is shorter than a response time of the focus servo control.

12 Claims, 17 Drawing Sheets

FOCUSING TIME PERIOD AND POWER CONTROL OF A MULTILASER DIODE ARRAY

BACKGROUND OF THE INVENTION

1. Field of the Invention

The present invention relates to a method and an apparatus for controlling the power of a semiconductor laser. In particular, the present invention relates to a method and an apparatus for controlling the power of a multibeam semiconductor laser which includes only one photodetector and a plurality of light emitting elements.

2. Description of the Related Art

In recent years, video/audio data has been rapidly digitalized. In particular, video signals produce a very large amount of data when digitalized. Therefore, recording/reproduction apparatuses for video signals are especially required to be capable of accommodating a large capacity and have a data high transfer rate. Various attempts have been made to realize a large data capacity and high data transfer rate for recording/reproduction apparatuses employing optical disks. In one such method, an input data sequence is divided into a plurality of portions which are respectively supplied to a plurality of heads, thereby resulting in parallel recording and/or reproducing of signals in a plurality of tracks on a disk, in order to realize a high transfer rate. This method makes it possible to increase the overall transfer rate performed by the plurality of tracks, without increasing the transfer rate of each head.

However, as the number of heads increases, there arises the problems of complicated control and increases in cost. Therefore, it is contemplated to employ a multibeam semiconductor laser in which a plurality of light emitting elements are provided, instead of a plurality of heads, thereby to record/reproduce signals on a plurality of tracks simultaneously. A multibeam semiconductor laser has a plurality of light emitting elements (such as laser diodes) and a photodetector within one package. The light emitting elements allow separate control of their respective output powers. By employing such a multibeam semiconductor laser, it becomes possible to record/reproduce signals at a high transfer rate in spite of a small number of heads.

The photodetector provided in a multibeam semiconductor laser is used for monitoring the intensity of light emitted by the light emitting elements. Specifically, when one of the light emitting elements radiates a light beam on a track for recording/reproduction, a portion of the light also illuminates the photodetector, which is disposed near the light emitting elements. The photodetector receives this portion of light and outputs a monitored current in proportion with the intensity of the light emitted by the light emitting element. Accordingly, by converting the monitored current into a monitored voltage and feeding back the monitored voltage to driving circuitry of the laser diode, it becomes possible to control the intensity of the light output by the light emitting element so as to be a constant level.

However, many multibeam semiconductor lasers only have one photodetector for a plurality of light emitting elements. As a result, the photodetector can output only one monitored current in response to the laser power output by the plurality of light emitting elements. In a multibeam semiconductor laser of this configuration, the photodetector is not capable of distinguishing the laser power of one light emitting element from the laser power of another light emitting element. This makes it impossible to perform simultaneous power control for more than one of the plurality of light emitting elements. In other words, when performing power control, all the light emitting elements except for the light emitting element that is subjected to power control must be in an off-state, i.e., not emitting light.

Japanese Laid-Open Patent Publication No. 3-3102656 includes a description on power control for a multibeam semiconductor laser. According to this document, all of the light emitting elements except for the one light emitting element that is subjected to power control are "off" (i.e., do not emit light), whereby the step of measuring the characteristics of the laser light intensity against a driving current for the laser is conducted in a time division manner. However, in this approach to power control, there are time periods during which the laser beam to be employed for focusing control and tracking control is not radiated. Absence of the laser beam for focusing control and tracking control results in absence of focusing error signals and tracking error signals, so that the focusing and tracking are liable to have large errors, imposing a considerable influence on the subsequent recording/reproduction. Therefore, the power control in the method disclosed in the above document is performed at the time of activating the apparatus or during the loading of a disk, i.e., prior to performing focusing control or tracking control.

The most common methods for recording on a rewritable optical disk are magnetooptical recording and phase change recording. Phase change recording, according to which a difference in reflectance between an amorphous state and a crystallized state of a recording medium is reproduced as a signal, has advantages relative to magnetooptical recording in that it allows direct overwriting and it has a high-level reproduced signal. However, in a phase change recording process, whether a recording medium takes an amorphous state or crystallizes depends solely on the heat applied to the recording medium. Therefore, phase change recording requires a more precise power control for the semiconductor laser than does magnetooptical recording. However, as described above, the method in which power control is performed only at the time of activating the apparatus or during the loading of a disk cannot realize recording/reproduction at an appropriate power level because the laser power varies over time. In other words, the relationship between the driving current for a semiconductor laser and the optical output power thereof varies depending on the ambient temperature and over the lapse of time since the activation of the apparatus. Therefore, when an accurate power adjustment is required, as in the case of recording/reproducing signals on a phase changeable disk, it is necessary to perform power control at a predetermined time interval even during recording/reproduction.

SUMMARY OF THE INVENTION

A method for controlling intensities of a plurality of laser beams respectively emitted on a track of an optical disk by a plurality of laser diodes according to the present invention includes a step of: performing focusing servo control for focusing one of the plurality of laser beams emitted by one of the plurality of laser diodes onto the track, and concurrently controlling an intensity of the laser beam emitted by each of plurality of laser diodes to be within a predetermined range by comparing a signal which is in accordance with an intensity of the laser beam emitted by that laser beam with a reference signal, wherein a period during which the one of the plurality of laser diodes used for the focusing does not emit the one laser beam is shorter than a response time of the focus servo control.

In one embodiment of the invention, the track is divided into a plurality of sectors, and the intensity of the laser beam emitted by each of the plurality of laser diodes is controlled to be within the predetermined range once for every N sectors, N being a natural number.

In another embodiment of the invention, the one of the plurality of laser diodes used for the focusing emits the laser beam over a period during which laser diodes other than the one laser diode used for the focusing are controlled.

Alternatively, a method for controlling intensities of a plurality of laser beams respectively emitted on a track of an optical disk by a plurality of laser diodes according to the present invention includes a step of: performing focusing servo control for focusing one of the plurality of laser beams emitted by one of the plurality of laser diodes onto the track, and concurrently controlling an intensity of the laser beam emitted by each of plurality of laser diodes to be within a predetermined range by comparing a signal which is in accordance with an intensity of the laser beam emitted by that laser beam with a reference signal, wherein a focusing error signal corresponding to the laser beam emitted by the one of the plurality of laser diodes used for the focusing is held over a period during which the one of the plurality of laser diodes used for the focusing does not emit the one laser beam.

Alternatively, a method for controlling intensities of a plurality of laser beams respectively emitted on a track of an optical disk by a plurality of laser diodes according to the present invention includes a step of: performing focusing servo control for focusing one of the plurality of laser beams emitted by one of the plurality of laser diodes onto the track, and concurrently controlling an intensity of the laser beam emitted by each of plurality of laser diodes to be within a predetermined range by comparing a signal which is in accordance with an intensity of the laser beam emitted by that laser beam with a reference signal, wherein the focusing is performed by using one of the plurality of laser diodes the intensity of whose laser beam is being controlled.

Alternatively, a method for controlling intensities of a plurality of laser beams respectively emitted on a track of an optical disk by a plurality of laser diodes according to the present invention includes a step of: performing focusing servo control for focusing one of the plurality of laser beams emitted by one of the plurality of laser diodes onto the track, and concurrently controlling an intensity of the laser beam emitted by each of plurality of laser diodes to be within a predetermined range by comparing a signal which is in accordance with an intensity of the laser beam emitted by that laser beam with a reference signal, wherein the one of the plurality of laser diodes used for the focusing emits the laser beam while the intensities of the laser beams emitted by laser diodes other than the one laser diode used for the focusing are controlled.

An apparatus for controlling intensities of a plurality of laser beams respectively emitted on a track of an optical disk by a plurality of laser diodes according to the present invention includes: a focusing servo controller for focusing one of the plurality of laser beams emitted by one of the plurality of laser diodes onto the track; a controller for controlling an intensity of the laser beam emitted by each of plurality of laser diodes to be within a predetermined range by comparing a signal which is in accordance with an intensity of the laser beam emitted by that laser beam with a reference signal; and a section for setting a period during which the one of the plurality of laser diodes used for the focusing does not emit the one laser beam to be shorter than a response time of the focus servo control.

In one embodiment of the invention, the track is divided into a plurality of sectors, and the intensity of the laser beam emitted by each of the plurality of laser diodes is controlled to be within the predetermined range once for every N sectors, N being a natural number.

In another embodiment of the invention, the one of the plurality of laser diodes used for the focusing emits the laser beam over a period during which laser diodes other than the one laser diode used for the focusing are controlled.

Alternatively, an apparatus for controlling intensities of a plurality of laser beams respectively emitted on a track of an optical disk by a plurality of laser diodes according to the present invention includes: a focusing servo controller for focusing one of the plurality of laser beams emitted by one of the plurality of laser diodes onto the track; a controller for controlling an intensity of the laser beam emitted by each of plurality of laser diodes to be within a predetermined range by comparing a signal which is in accordance with an intensity of the laser beam emitted by that laser beam with a reference signal; and a hold section for holding a focusing error signal corresponding to the laser beam emitted by the one of the plurality of laser diodes used for the focusing over a period during which the one of the plurality of laser diodes used for the focusing does not emit the one laser beam.

Alternatively, an apparatus for controlling intensities of a plurality of laser beams respectively emitted on a track of an optical disk by a plurality of laser diodes according to the present invention includes: a focusing servo controller for focusing one of the plurality of laser beams emitted by one of the plurality of laser diodes onto the track; a controller for controlling an intensity of the laser beam emitted by each of plurality of laser diodes to be within a predetermined range by comparing a signal which is in accordance with an intensity of the laser beam emitted by that laser beam with a reference signal; and a focusing section for performing the focusing by using one of the plurality of laser diodes the intensity of whose laser beam is being controlled.

Alternatively, an apparatus for controlling intensities of a plurality of laser beams respectively emitted on a track of an optical disk by a plurality of laser diodes according to the present invention includes: a focusing servo controller for focusing one of the plurality of laser beams emitted by one of the plurality of laser diodes onto the track; a controller for controlling an intensity of the laser beam emitted by each of plurality of laser diodes to be within a predetermined range by comparing a signal which is in accordance with an intensity of the laser beam emitted by that laser beam with a reference signal; and a section for controlling the one of the plurality of laser diodes used for the focusing to emit the laser beam while the intensities of the laser beams emitted by laser diodes other than the one laser diode used for the focusing are controlled.

According to the present invention, a monitored current output from a photodetector in a semiconductor laser is subjected to a current/voltage conversion and thereafter is compared against a predetermined reference voltage so as to set a driving current level for the laser. Moreover, a laser power control circuit for holding these predetermined values and supplying a laser driving current in accordance with the held values is provided for each light emitting element. The adjustment of the laser power of a plurality of light emitting elements is realized by time-dividing the laser power control process and performing the time-divided process for each sector or each few sectors.

In such laser power control based on time division, it is necessary to ensure that all the light emitting elements except for the one light emitting element that is subjected to power control are "off" in order to accurately control the laser power of each light emitting element. However, in the case of performing focusing control and tracking control by using output light of one of the plurality of light emitting elements, the apparatus goes out of servo when the light emitting element employed for focusing/tracking is "off".

Therefore, in order to reduce the influence on the focusing control and tracking control, it is necessary to predetermine the period during which the light emitting element used for focusing/tracking is "off" for the sake of laser power control to be shorter than the response time of a control loop. This can be realized by conducting laser power control for the plurality of light emitting elements over a plurality of sectors. Alternatively, in the case of simultaneously performing laser power control for a number of light emitting elements, it becomes possible to prevent the focusing control loop and the tracking control loop from receiving disturbance by radiating a laser beam from the light emitting element used for focusing control and tracking control during the power control.

As described above, it is impossible to obtain focusing error signals or tracking error signals in periods during which the light emitting element used for focusing control and tracking control is "off". Therefore, during such an off period, values of a focusing error signal and a tracking error signal which were held immediately before that off period started are used. Thus, the influence on the focusing control and tracking control can be reduced. Moreover, tracking/focusing control is performed by using light emitting elements which are subjected to laser power control (i.e., currently "on") rather than by using a light beam emitted by only one light emitting element. As a result, it becomes possible to always obtain a focusing error signal and a tracking error signal. Alternatively, the influence on the focusing/tracking control can also be reduced by selecting the light emitting elements so as to minimize the off periods of the light emitting element for focusing/tracking control, instead of sequentially switching to the light emitting element which is currently subjected to laser power control.

In prior art, all the light emitting elements except for the one light emitting element that is subjected to power control are off. In contrast, according to the present invention, the light emitting element that is used for focusing/tracking control is kept activated at a predetermined power level even after being subjected to laser power control, thereby preventing disturbance on the control loops. When controlling the laser power of the light emitting elements other than the one used for focusing/tracking control, a value equivalent to a predetermined power emitted by the light emitting element used for focusing/tracking control is electrically cancelled. As a result, it becomes possible to control the laser power of all the light emitting elements without causing disturbance on the control loops.

Thus, the invention described herein makes possible the advantages of (1) providing accurate laser power control for a multibeam semiconductor laser which includes a plurality of light emitting elements and one photodetector; and (2) reducing the influence of laser power control on focusing control or tracking control.

These and other advantages of the present invention will become apparent to those skilled in the art upon reading and understanding the following detailed description with reference to the accompanying figures.

DESCRIPTION OF THE PREFERRED EMBODIMENTS

Hereinafter, the method and apparatus for controlling the power of a multibeam semiconductor laser according to the present invention will be described with reference to the accompanying figures. In the figures, like numerals indicate like constituent elements.

EXAMPLE 1.

Figure 1:
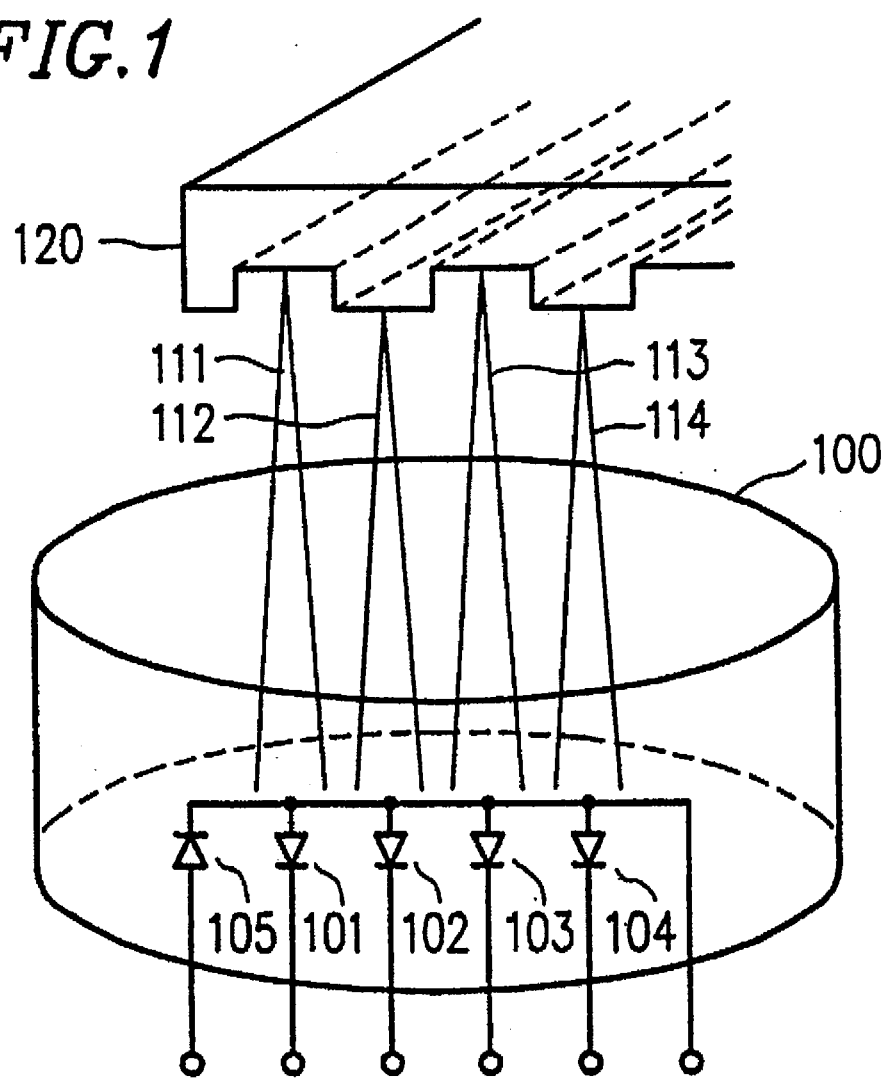
FIG. 1 is a schematic diagram showing a multibeam semiconductor laser used for the method and apparatus for controlling the power of a multibeam semiconductor laser according to the present invention.

FIG. 1 is a schematic diagram showing a multibeam semiconductor laser used for the method and apparatus for controlling the power of a multibeam semiconductor laser according to the present invention. The multibeam semiconductor laser 100 (hereinafter referred to as the "laser device"), which is capable of emitting four beams, includes four laser elements 101 to 104 and a photodetector 105 within its package. A semiconductor laser emitting a laser beam having a wavelength of 680 nm, for example, can be used as the laser elements 101 to 104. The laser elements 101 to 104 radiate laser beams 111 to 114, respectively, to lands and grooves of an optical disk 120. Although four laser beams are radiated on the optical disk 120 by using four laser elements, the present invention has no limits as to the number of laser elements to be used; for example, it is also applicable to employ two laser elements for emitting two laser beams.

The optical disk 120 is a phase changeable disk. In order to read, write and erase data on a phase changeable disk, laser beams having three different intensities are required. Specifically, a read power Pr used for reading data, a peak power Pp used for writing data, and a bias power Pb used for erasing data are required and must satisfy the relationship Pr<Pb<Pp.

When the laser elements 101 to 104 emit the laser beams 111 to 114, the laser beams 111 to 114 are liable to irregular reflection within a mold filling the laser device 100. As a result, a portion of the laser beams 111 to 114 enters the photodetector 105. The photodetector 105 supplies as an output an electric current in proportion to the intensity of the light incident thereon. In other words, the photodetector 105 outputs currents (hereinafter referred to as "monitored currents") which are in proportion to the respective intensities of the laser beams 111 to 114. As the photodetector 105, a photodiode can be used which is sensitive in the region of wavelengths emitted by the laser beams 111 to 114 (e.g., about 680 nm). Hereinafter, the intensity of an emitted laser beam will be referred to as "laser power".

Figure 2:
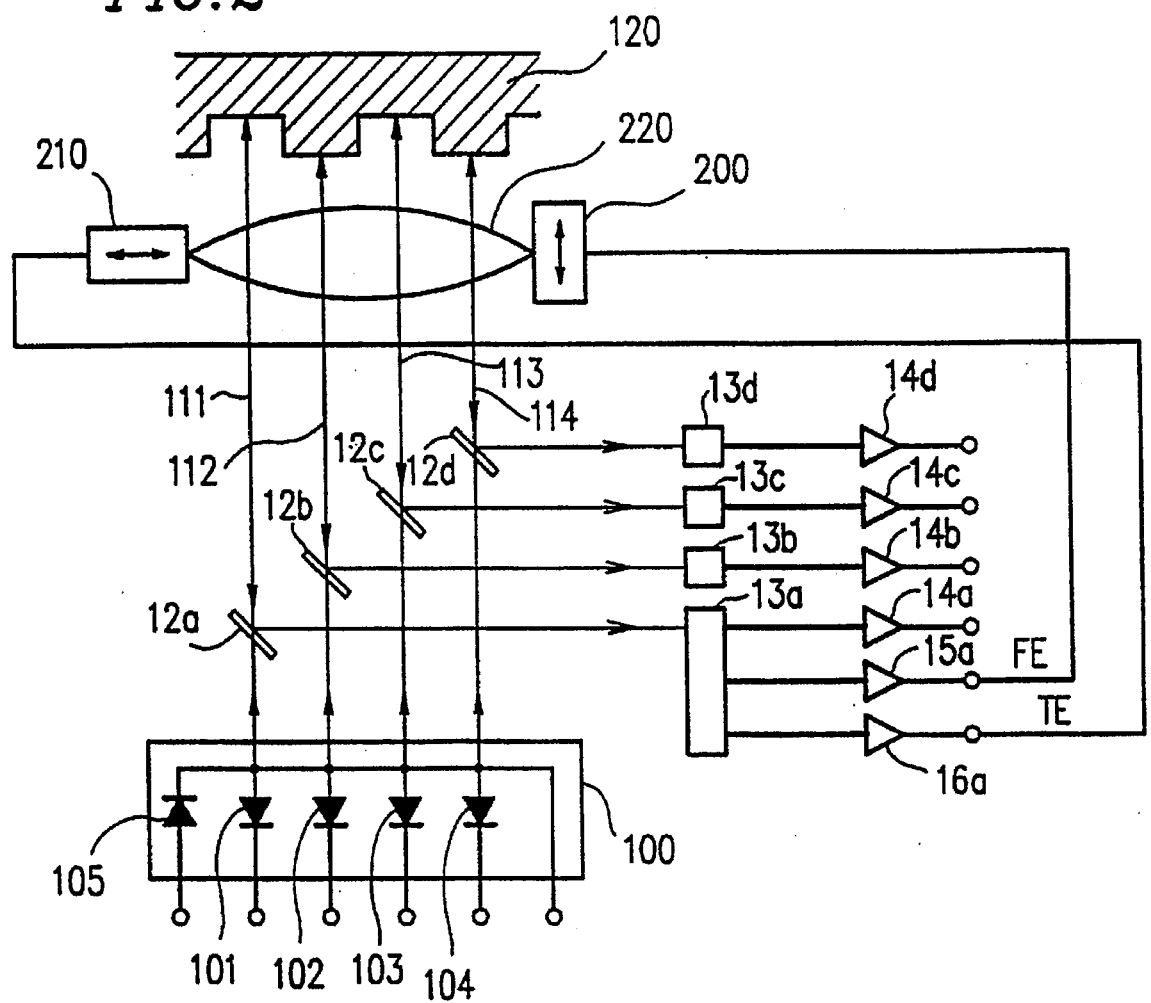
FIG. 2 is a block diagram showing a reproduction system and a feedback control system of system for an optical disk 120 employing a laser device 100.

FIG. 2 is a block diagram showing a reproduction system and a feedback control system for the optical disk 120 employing the laser device 100. The four laser elements 101 to 104 radiate the laser beams 111 to 114, respectively, on the lands and grooves of the optical disk 120. The laser beams 111 to 114 are converged on a recording film of the lands and grooves so as to perform recording/reproduction of data. The laser beams 111 to 114 are reflected from the optical disk 120, and further reflected by half mirrors 12a to 12d to enter detectors 13a to 13d. The detectors 13a to 13d output reproduced signals in accordance with their respective incident laser beams 111 to 114 to amplifiers 14a to 14d, respectively. The amplifiers 14a to 14d amplify the reproduced signals and output the amplified signals. As well as outputting the reproduced signal, the detector 13a outputs a focusing error signal FE and a tracking error signal TE to the amplifiers 15a and 16a, respectively. The focusing error signal FE and the tracking error signal TE can be generated by an astigmatism method using a four-split photodiode.

The amplifier 15a amplifies the focusing error signal FE and outputs the amplified focusing error signal FE to a focusing actuator 200. As a result, negative feedback is imposed in accordance with the amount of focusing error. The focusing actuator 200 moves an objective lens 220 along a direction parallel to the optical axis, thereby achieving a feedback control for reducing the spot sizes of the laser beams 111 to 114 on corresponding tracks (i.e., the lands or grooves) of the optical disk 120. This control will hereinafter be referred to as "focusing control".

The amplifier 16a amplifies the tracking error signal TE and outputs the amplified tracking error signal TE to a tracking actuator 210. As a result, negative feedback is imposed in accordance with the amount of focusing error. The tracking actuator 210 moves the objective lens 220 along a radial direction of the optical disk 120, thereby achieving a feedback control for positioning the spot of the laser beams 111 to 114 onto corresponding tracks (i.e., the lands or grooves) of the optical disk 120. This control will hereinafter be referred to as "tracking control".

Figure 3A:
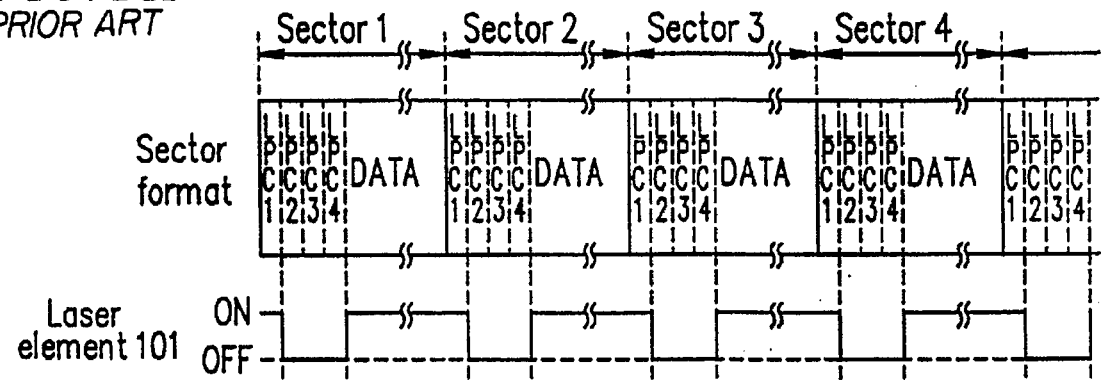
FIG. 3A is a diagram showing the states of laser elements and a sector format in laser power control according to prior art.
Figure 3B:
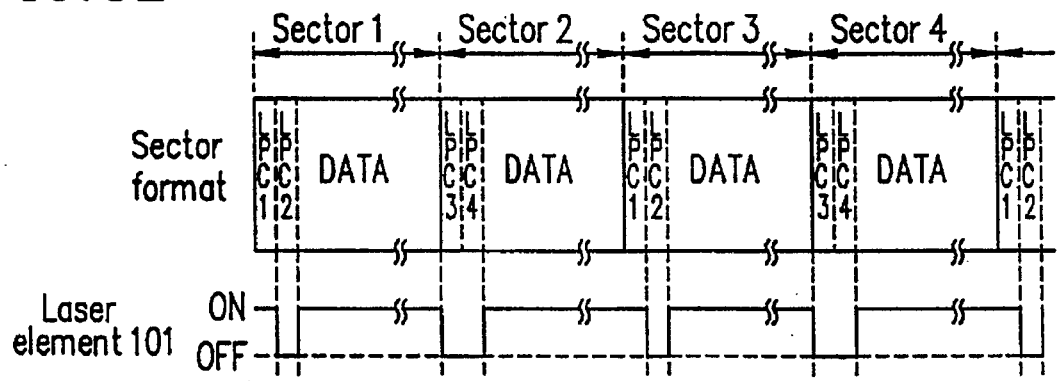
FIG. 3B is a diagram showing the states of laser elements and a sector format in laser power control according to the present invention.
Figure 3C:
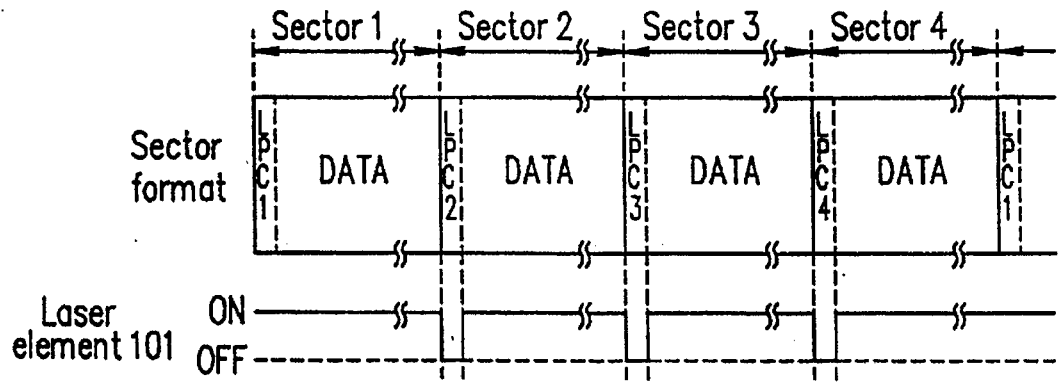
FIG. 3C is a diagram showing the states of laser elements and a sector format in laser power control according to the present invention.

FIG. 3A is a diagram showing the states of laser elements and a sector format in laser power control according to the prior art. FIGS. 3B and 3C are diagrams showing the states of laser elements and a sector format in laser power control according to the present invention.

Sectors 1 to 4 shown in FIG. 3A are located consecutively on a track (i.e., land or groove). Each sector includes laser power control areas (hereinafter referred to as "control areas") LPC1 to LPC4 at the top thereof. In the control areas LPC1 to LPC4, the respective laser power levels of the laser elements 101 to 104 are controlled. Subsequent to the control areas LPC1 to LPC4 is a data area DATA. The recording/reproduction of data is performed in the data area DATA. A time duration $T_{LPC}$ required for a laser beam to pass through each of the control areas LPC1 to LPC4 is in the order of 1 μs. A time duration $T_{DATA}$ required for a laser beam to pass through the data area DATA is in the order of 1 ms.

In each sector shown in FIG. 3A, the laser element 101 radiates a laser beam in the control area LPC1 (hereinafter, this state of a laser element will be referred to as an "on-state"), and does not radiate a laser beam in the control areas LPC2 to LPC4 (hereinafter, this state of a laser element will be referred to as an "off-state"). In the data area DATA, the laser element 101 is always in an on-state in order to perform recording/reproduction of data.

As described above, the laser beam emitted from the laser element 101 is used for focusing control and tracking control. Accordingly, neither the focusing error signal FE nor the tracking error signal TE is obtained during the off-state periods (i.e., periods during which the laser element 101 does not emit a laser beam), so that a disturbance is caused in the control loops involved in the focusing control and tracking control. However, if the period of time during which a disturbance arises is shorter than a predetermined period (described later), the control loops are substantially free from its influence. If the disturbance is applied for a period which is longer than the predetermined period, the control loops are unfavorably affected by the disturbance, that is, the focusing error and tracking error become substantial enough to cause malfunction in recording/reproducing operation. A rise time Tf of the focusing control loop and the period Toff during which the laser element 101 is off-state must satisfy the following relationship:

$$\text{Toff} < \text{Tf} \qquad \text{Equation 1}$$

The reason why Equation 1 must be satisfied is that the focusing control is constantly performed while the optical disk is rotating. On the other hand, the tracking control may not be performed during operations other than the usual recording/reproducing operations, e.g., during track jumps. Therefore, it is preferable that a rise time Tt of the tracking control loop satisfy the following relationship as well as the relationship. described in Equation 1:

$$\text{Toff} < \text{Tt} \qquad \text{Equation 2}$$

Herein, the "rise time", which is also referred to as a "response time" of a control loop, is defined as a time duration which is required for an output of a feedback control loop whose input is a unit step function (vary from 0 to 1.0) to vary from 0.1 to 0.9. In Example 1, Tf is 20 µs and Tt is 20 µs. In the laser power control of the prior art as illustrated in FIG. 3A, Toff is 27 µs in either one of the sectors 1 to 4, thus failing to satisfy Equation 1 and Equation 2. Therefore, laser power control by the prior art permits a large disturbance to be applied to the control loop for focusing control and tracking control due to the off-states of the laser element 101. As a result, according to the prior art, there are periods (even if only temporarily) when recording/reproducing operation is malfunctioned.

On the other hand, according to the power control method of the present invention described in FIGS. 3B and 3C, the off-state periods Toff of the laser element 101 are shorter than those in the prior art. According to the method of the present invention represented in FIG. 3B, the laser power of two laser elements is controlled in each sector. Specifically, in the control areas LPC1 and LPC2, the laser power of the laser elements 101 and 102 is controlled. In the control areas LPC3 and LPC4, the laser power of the laser elements 103 and 104 is controlled. As a result, Toff equals $T_{LPC}$ (=9 µs) in the sectors 1 and 3. Toff equals $2T_{LPC}$ (=18 µs) in the sectors 2 and 4. Therefore, both Equation 1 and Equation 2 are satisfied, so that any disturbance to an extent that will nonfavorably affect the recording/reproduction is not applied to the focusing control loop and the tracking control loop. According to the method of the present invention described in FIG. 3C, the laser power of one laser element is controlled in each sector. As a result, Toff equals 0 seconds (i.e., the laser element 101 is not turned off) in the sector 1. Toff equals $T_{LPC}$ (=9 µs) in the sectors 2 to 4. Therefore, both Equation 1 and Equation 2 are also satisfied. Even a smaller disturbance is applied to the focusing control loop and the tracking control loop than in the case of the method described in FIG. 3C.

Figure 4:
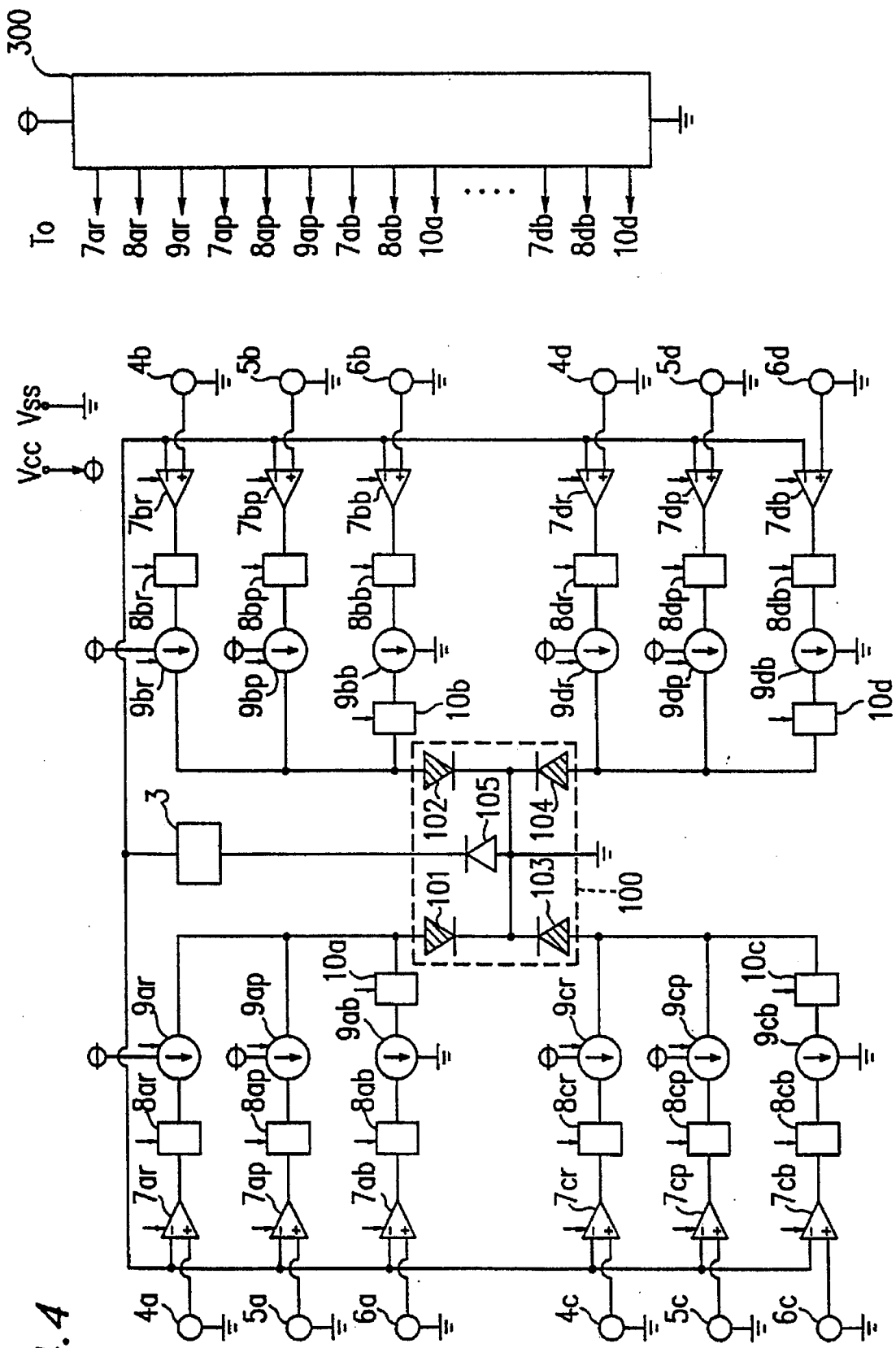
FIG. 4 is a circuit diagram showing a laser power control apparatus according to the present invention.

FIG. 4 is a circuit diagram showing a laser power control apparatus according to the present invention. The laser device 100 includes laser elements 101 to 104 and a photodetector 105. A current/voltage convertor 3 converts monitored currents which are output from the photodetector 105 and which are in proportion with the respective laser power levels of the laser elements 101 to 104, into voltages (hereinafter referred to as "monitored voltages"). Although the focusing control loop, the tracking control loop, and the optical system shown in FIG. 2 are omitted in FIG. 4, these control loops and the optical system are also used in Example 1.

As described earlier, the laser elements 101 to 104 can have different laser power levels even when supplied with the same current. This is mainly due to the variations between laser elements. Also, with respect to each given laser element 101 to 104, the same current does not always result in the same laser power level. This is due to the change in the temperature of the laser elements (e.g., heating of the laser elements when emitting laser beams), thereby causing change in the relationship between the driving current for the semiconductor laser and the output optical power thereof. Therefore, it is preferable to perform laser power control for each one of the laser elements 101 to 104 at least once each predetermined time (for example, a time period in the order of 10 ms).

In FIG. 4, the respective circuits (whose elements are indicated by reference numerals with lowercase alphabets starting with a to d, respectively) for controlling the laser power of the laser elements 101 to 104 have the same function. Therefore, only the circuit for controlling the laser power of the laser element 101 (whose elements are indicated by reference numerals with lower-case alpha characters starting with a) is described in detail here for sake of simplicity. The circuits for controlling the laser power of the laser elements 102 to 104 (whose elements are indicated by reference numerals with lower-case alpha characters starting with b to d, respectively) function in the same manner the circuit for controlling the laser power of the laser element 101 does. In FIG. 4, a power supply is coupled to Vcc and Vss.

Figure 5:
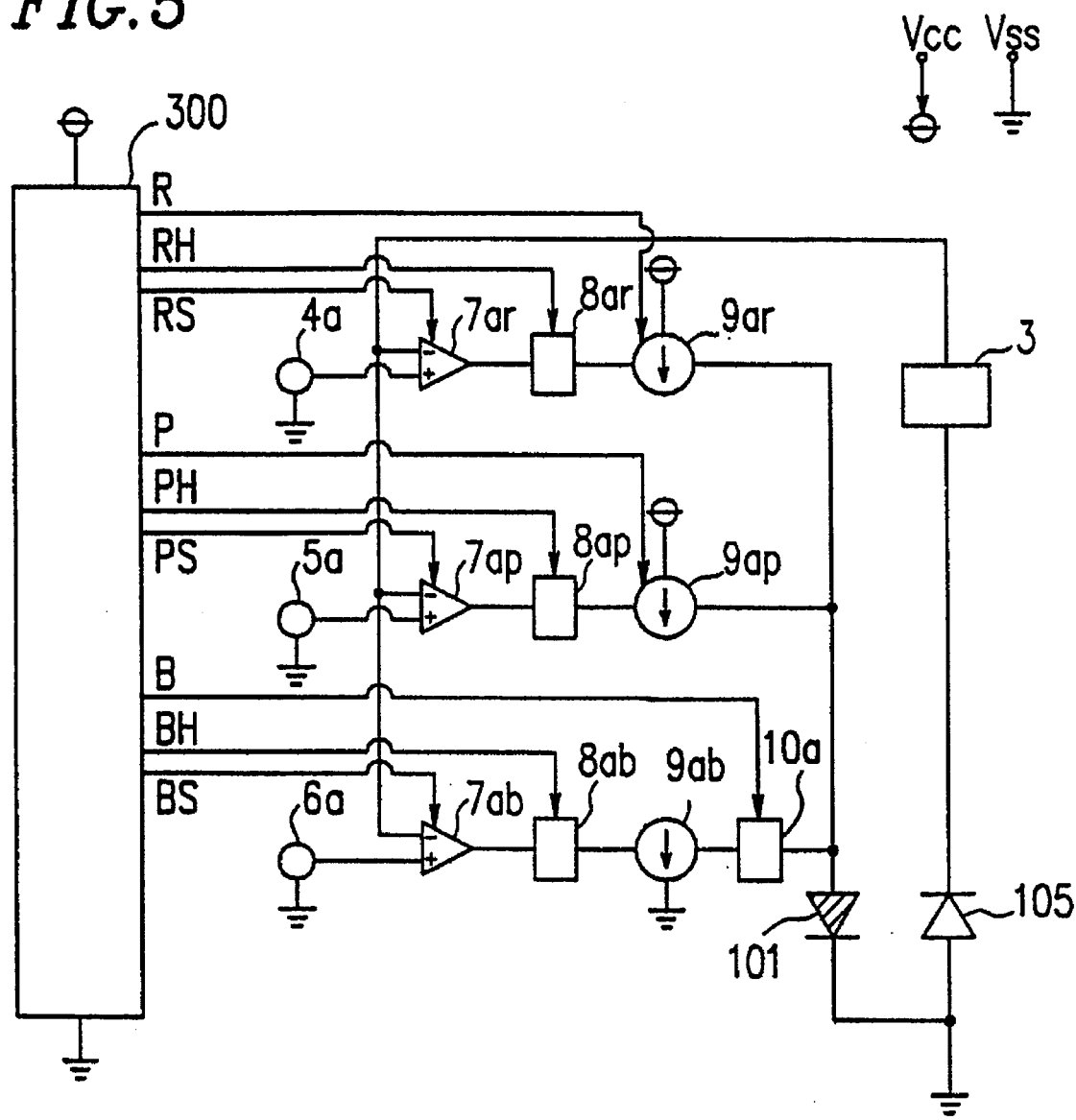
FIG. 5 is a circuit diagram showing a portion of the circuit shown in FIG. 4 that relates to a laser element 101 and a photodetector 105.

FIG. 5 is a circuit diagram showing a portion of the circuit shown in FIG. 4 that relates to the laser element 101 and the photodetector 105. Comparators 7ar, 7ap, and 7ab, hold circuits 8ar, 8ap, and 8ab, current sources 9ar and 9ap, and a switching circuit 10a receive control voltages RS, PS, BS, RH, PH, BH, R, P, and B, respectively, via their respective control terminals. In FIG. 4, control terminals are indicated by arrows, with the wiring between a control voltage generator 300 and the respective control terminals being omitted. As described later, the function of each element is activated only when the control voltage applied to its control terminal is at an L (low) level. The control voltage generator 300 outputs the control voltages necessary for all the comparators, hold circuits, current sources, and switching circuits.

A reference voltage source 4a generates a reference voltage when controlling the read power. The comparator 7ar receives via its inverted input terminal a monitored voltage output from the current/voltage convertor 3 and receives via its non-inverted input terminal a reference voltage output from the reference voltage source 4a. Thus, the comparator 7ar generates an output which is in proportion with a difference between the monitored voltage and the reference voltage and provides such output to the hold circuit 8ar. The comparator 7ar outputs the difference between the input voltages only when the control voltage RS is at the L level. The hold circuit 8ar holds an input voltage and outputs the voltage to the current source 9ar. The hold circuit 8ar samples the input voltage at the moment when the control voltage RH shifts from a H (high) level to the L level. The hold circuit 8ar holds the input voltage and outputs it when the control voltage RH is at the L level; when the control voltage RH is at the H level, the hold circuit 8ar simply allows the input voltage to pass from the input to the output. The current source 9ar receives the voltage held in the hold circuit 8ar (which is in accordance with the difference between the monitored voltage and the reference voltage) as an input, and outputs to the laser element 101 a driving current which is in accordance with the held voltage. The current source 9ar outputs a current when the control voltage R is at the L level, but does not output a current when the control voltage R is at the H level.

In accordance with the above-described configuration, while controlling the read power (hereinafter, such a period will be referred to as a "read power controlling period"), feedback control is performed so that the read power corresponding to the voltage from the reference voltage source 4a is output from the laser element 101. After the laser power has sufficiently settled, the laser power is held, and the read power controlling period ends.

The reference voltage source 5a, the comparator 7ap, the hold circuit 8ap, and the current source 9ap function to control the peak power in a manner similar to the read power control. The comparator 7ap, the hold circuit 8ap, and the current source 9*ap* receive the control voltages PS, PH, and P, respectively. The reference voltage source 6*a*, the comparators 7*ab*, the hold circuit 8*ab*, the current source 9*ab*, and the switching circuit 10*a* control the bias power in a manner similar to the above-described read power control except that the current source 9*ab* is of a current-draining type and the switching circuit 10*a* controls the draining of current by the current source 9*ab*. Specifically, the current source 9*ab* does not have a control terminal, but drains a current through the laser element 101 via the switching circuit 10*a* when the control voltage of the switching circuit 10*a* is at the L level. The comparator 7*ab*, the hold circuit 8*ab*, and the switching circuit 10*a* receive the control voltages BS, BH, and B, respectively.

When emitting a laser beam at the read power, the current from the current source 9*ar* is supplied to the laser element 101. When emitting a laser beam at the peak power, a sum of the current from the current source 9*ar* and the current from the current source 9*ap* is supplied to the laser element 101. When emitting a laser beam at the bias power, a sum of the current from the current source 9*ar* and the current from the current source 9*ap* minus the current which flows into the current source 9*ab* is supplied to the laser element 101.

After the read power control period ends, a peak power control period (during which the peak power is controlled) and a bias power control period follow, respectively. The laser power control for the laser element 101 is finished as these three kinds of laser power control are all finished.

As shown in FIG. 3B, when the laser power control for the laser element 101 finishes at the control area LPC1 of the sector 1, laser power control for the laser element 102 is subsequently performed at the control area LPC2 in the same sector 1. When the laser power control for the laser element 102 finishes, recording/reproduction of data is performed in the data area DATA. In FIG. 3C, when the laser power control for the laser element 101 finishes at the control area LPC1 of the sector 1, recording/reproduction of data is performed in the data area DATA. When the recording/reproduction of data in the data area DATA is finished, laser power control for the laser element 102 is performed at the control area LPC2 in the sector 2.

Figure 6:
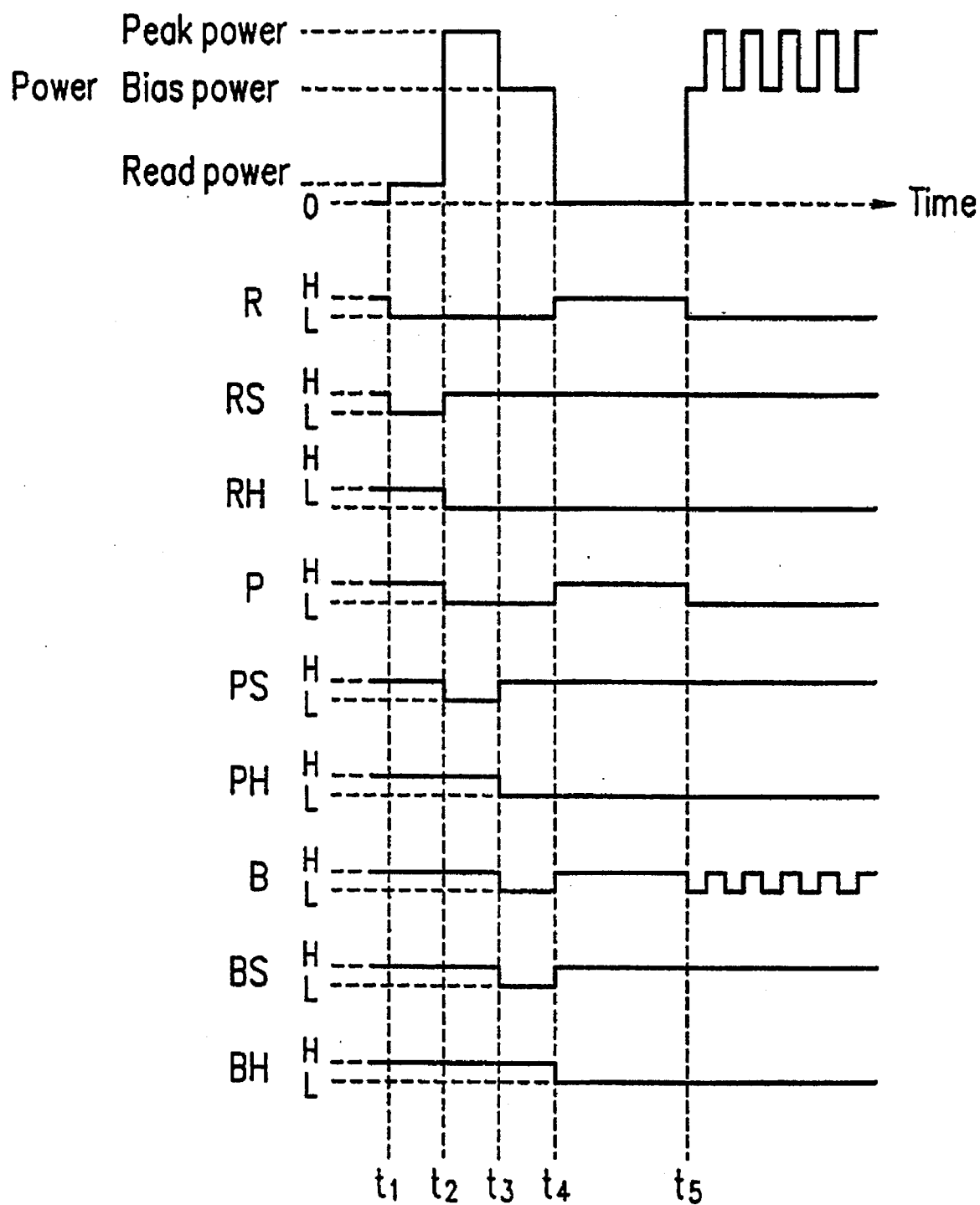
FIG. 6 is a timing diagram illustrating the control voltage of the laser element 101.

FIG. 6 is a timing diagram illustrating the control voltage of the laser element 101. Reference numerals t1 to t5 indicate points in time. Hereinafter, the period between t1 to t2, etc. will be referred to as a "period (t1, t2)", etc. for simplicity. The period (t1, t2), the period (t2, t3), and the period (t3, t4) are a read power control period, a peak power control period, and a bias power control period, respectively. The period (t4, t5) is a laser power control period for another laser element (e.g., the laser element 102 in the case of FIG. 3B). At time t5 and after, recording/erasing is performed by modulating the laser power with data to be recorded/erased and emitting a laser beam at the peak or bias power. Specifically, the bias power corresponds to data "0"; the peak power corresponds to data "1".

FIG. 6 shows a waveform Power of the laser power output from the laser element 101. As described above, the three kinds of laser power, i.e., the read power (used for reading of data), the bias power (used for erasing of data), and the peak power (used for recording of data) increases in this order (i.e., read power<bias power<peak power). In recording/erasing, a laser beam is emitted at different laser power levels in accordance with the data to be recorded.

The control voltages are all based on the "negative logic". That is, the respective function associated therewith is activated (hereinafter referred to as the "on-state") when each control voltage is at the L level. On the contrary, the H level will be referred to as the "off-state". As the control voltage B shifts to the on-state at time t1, the laser element 101 starts emitting a laser beam at the read power. Since the control voltage RS also shifts to the on-state at the same time, the comparator 7*ar* compares the reference voltage output from the reference voltage source 4*a* with the monitored voltage so as to subject the laser power to a feedback control. The read power of the laser element 101 converges to a laser power level corresponding to the voltage which was set by the reference voltage source 4*a* over a time period of 2 μs. Since the period (t1, t2) is about 3 μs, the laser power control for the read power can be finished well before time t2.

As the control voltage RS shifts to the off-state at time t2, the control voltage RH shifts to the on-state. In other words, the hold circuit 8*ar* samples at time t2 the voltage controlled by the comparator 7*ar* and holds the voltage during the period (t2, t4), at time t5, and after.

The current source 9*ar* supplies a driving current to the laser element 101 in accordance with the voltage held in the hold circuit 8*ar* when the control voltage R is in the on-state. The control voltage R is in the on-state during the period (t1, t4), at time t5, and after, so that the laser element 101 emits a laser beam of at least the read power during these periods.

The peak power control is also performed in a manner similar to the read power control. The control voltages P and PS shift to the on-state at time t2, at which the read power control is finished. Since the control voltage PS is in the on-state in the period (t2, t3), feedback control is performed for the peak power of the laser element 101 so that the peak power will converge to the laser power corresponding to the voltage set by the reference voltage source 5*a*. During the period (t2, t3), the laser element 101 is driven by a sum of the current from the current source 9*ar* and the current from the current source 9*ap*.

At time t3 at which the peak power control finishes, since the control voltage PH shifts to the on-state, the hold circuit 8*ap* holds the output from the comparator 7*ap* as converged by the feedback control. When the laser element 101 emits a laser beam at the peak power, the currents from both current sources 9*ar* and 9*ap* flow into the laser element 101. As a result, the current source 9*ap* only needs to supply the laser element 101 with a driving current corresponding to the difference between the read power and the peak power. In other words, the current which is required for emitting a laser beam at the peak power can be supplied by the two current sources, so that the output current capacity of each current source can be smaller than in the case of supplying the current by only one current source. Moreover, less time is required for the laser power to rise to the peak power as compared with the case where only one current source is employed.

When emitting a laser beam at the bias power, the current source 9*ab* drains a portion of the currents from the current sources 9*ar* and 9*ap* to ground. Thus, the current source 9*ab* drains a current equivalent to the difference between the peak power and the bias power. In the period (t3, t4), during which the control voltage B input to the switching circuit 10*a* is in the on-state, the switching circuit 10*a* is in a conductive state, so that it bypasses a portion of the currents output from the current sources 9*ar* and 9*ap* and drains that portion to ground. In the period (t3, t4), the control voltage BS is in the on-state. Therefore, a feedback control is made so that the bias power of the laser element 101 converges to a laser power level corresponding to the voltage which was set by the reference Voltage source 6*a*, as in the case of the read power control.

At time t4, at which the bias power control finishes, the control voltage BH is in the on-state so that the hold circuit 8ab holds the output from the comparator 7ab as converged by the feedback control.

Thus, in the period (t1, t4), feedback control is performed for the read power, the peak power, and the bias power of the laser element 101. At time t4 and after, the converged value of each laser power is held. In the period (t4, t5), the laser power of another laser element (e.g., the laser element 102 in the case of FIG. 3B) is controlled in a similar manner.

At time t5 and after, a laser beam is emitted at the read power by placing the control voltage R in the on-state; a laser beam is emitted at the peak power by placing the control voltages R and P in the on-state; and a laser beam is emitted at the bias power by placing the control voltages R, P, and B in the on-state. When recording data on the optical disk 120, the control voltage B is turned on or off in synchronization with the data to be recorded. As a result, the laser element 101 is modulated by the different power levels of the peak power and the bias power, in accordance with the data to be recorded.

Figure 7:
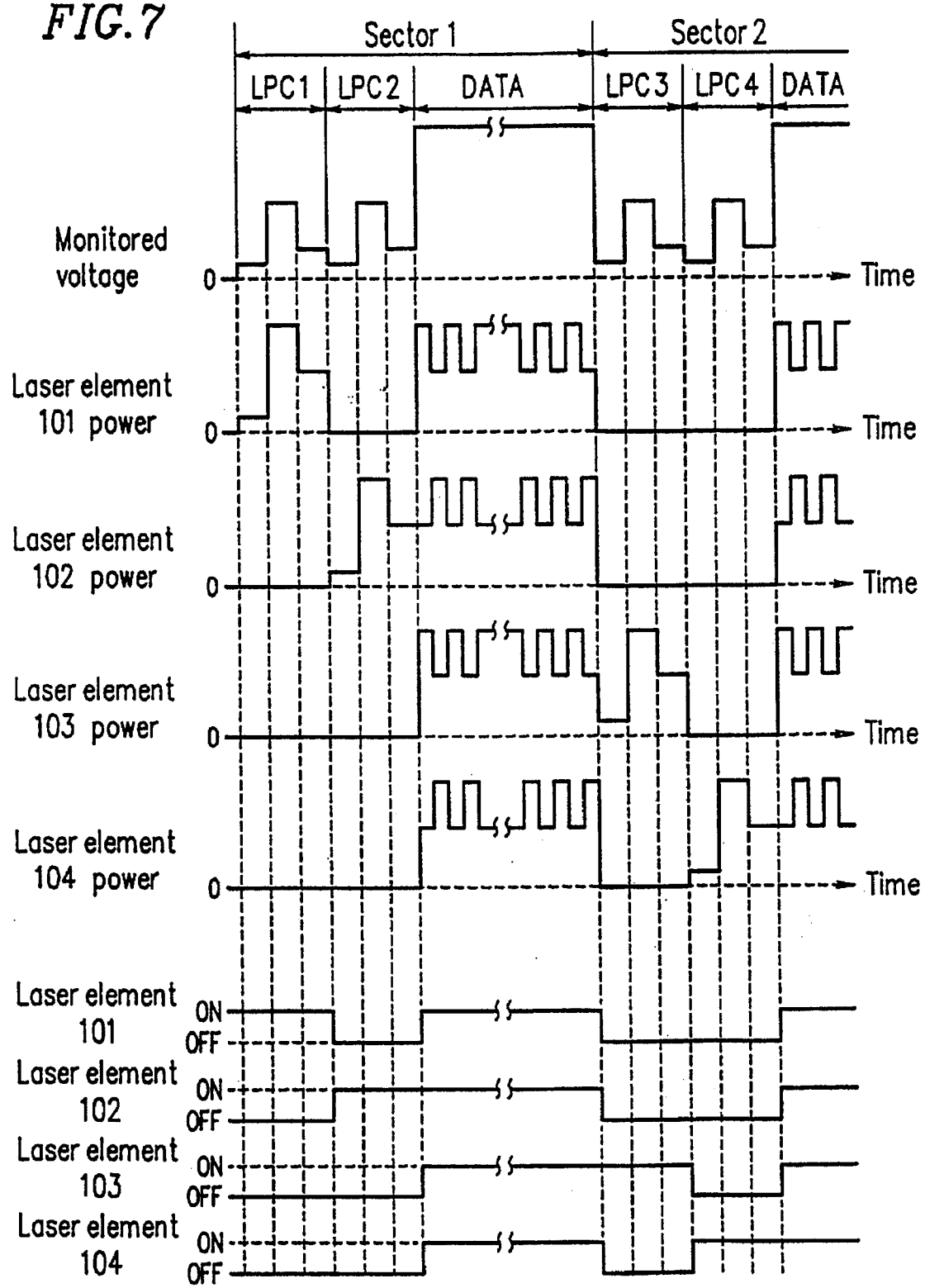
FIG. 7 is a timing diagram showing the respective output power and the states of the respective laser beams of laser elements 101 to 104 in the laser power control described in FIG. 3B along with the monitored voltages.

FIG. 6 shows the control of the three kinds of laser power only with respect to the laser element 101. FIG. 7 is a timing diagram showing the respective output power and the states (i.e., on-state and off-state) of the respective laser elements 101 to 104 in the laser power control described in FIG. 3B along with the monitored voltage. As shown in FIG. 7, Toff of the laser element 101 equals $T_{LPC}$ in the sector 1, and equals $2T_{LPC}$ $(=2T_{LPC})$ sector 2. Therefore, it is necessary that Toff $(=2T_{LPC})$ satisfies the above-mentioned Equation 1. It is preferable that Toff also satisfies Equation 2.

In order to reduce the influence of the off-state of the laser elements on the focusing control and the tracking control, it is desirable to reduce the amount of time required for the power control for each laser element. Since the time amount required for the laser power control depends on the frequency characteristics of the laser element and the circuitry used for controlling the laser power of that laser element, it has a lower limit (i.e., a minimum possible value). The more laser elements that are provided, the longer the laser power control takes, thereby making it more difficult to satisfy Equation 1 and Equation 2.

In accordance with the laser power control method and the control apparatus according to Example 1 of the present invention, the period during which to perform laser power control is split in a manner described above, thereby ensuring that any laser element used for the focusing control and the tracking control is not in the off-state longer than the response time of the control loops for the focusing control and the tracking control, respectively.

Figure 8:
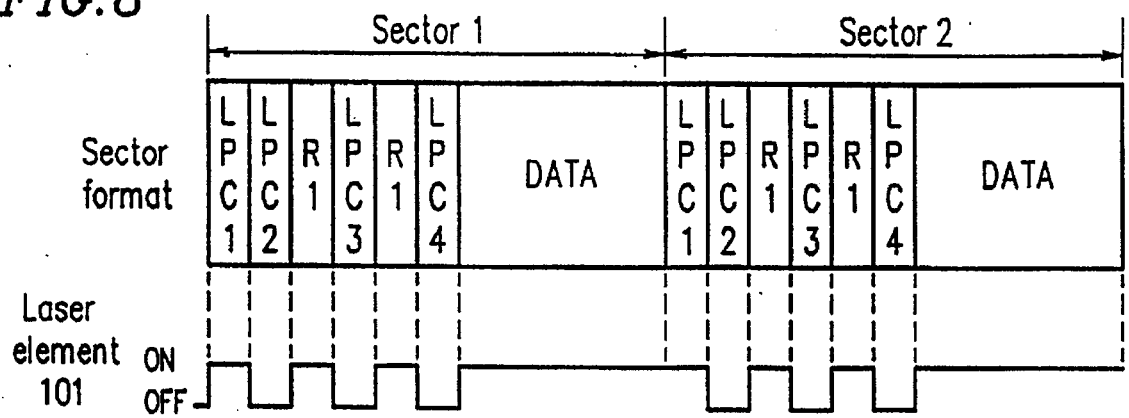
FIG. 8 shows a variation of Example 1 shown in FIG. 3B.

FIG. 8 shows a variation of the apparatus of Example 1 shown in FIG. 3B. In FIG. 8, laser power control is performed for the laser elements 101 to 104 in a single sector. In order to prevent a time period Toff during which a laser element 101 is off-state from increasing, the laser element 101 is placed in the on-state in a period R1 located between control areas LPC2 and LPC3 and in a period R1 located between control areas LPC3 and LPC4. Toff must satisfy Equation 1, and it is preferable that Toff also satisfy Equation 2. Herein, the time period $T_{LPC}$ during which laser beams pass through each of control areas LPC2 to LPC4 is 9 μs. Since Toff $(=T_{LPC})$ is 9 μs, Tf is 20 μs, and Tt is 20 μs, both Equation 1 and Equation 2 are satisfied.

EXAMPLE 2

Figure 9A:
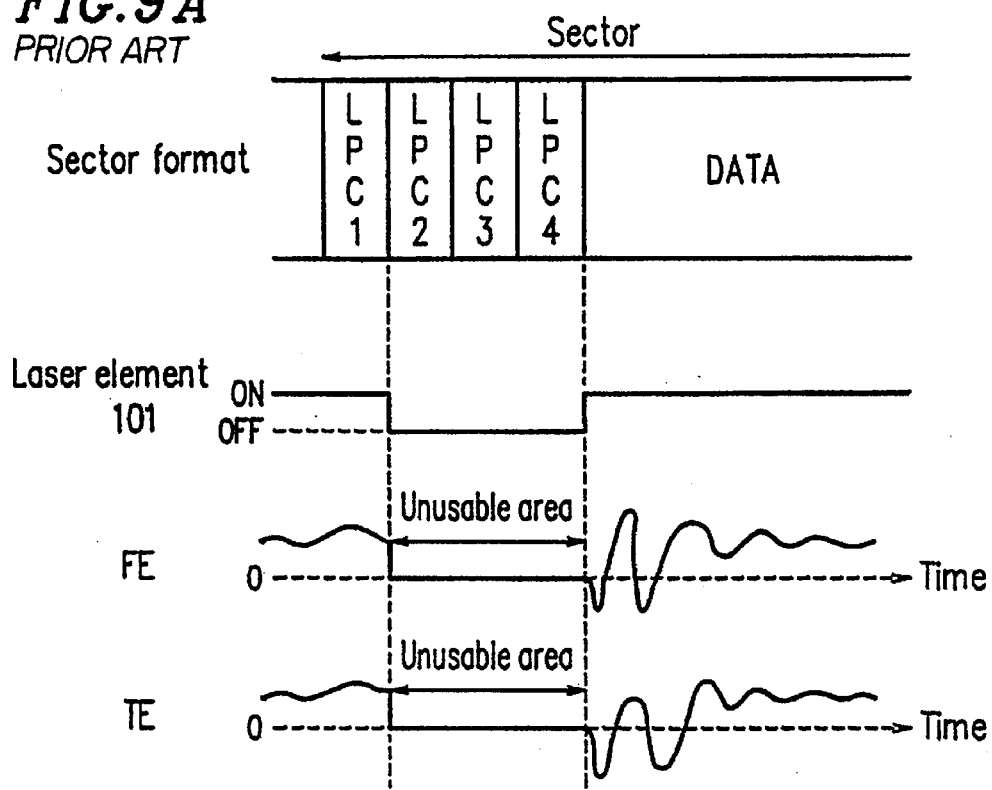
FIG. 9A is a diagram showing a focusing error signal and a tracking error signal in a conventional laser power control method and apparatus.
Figure 9B:
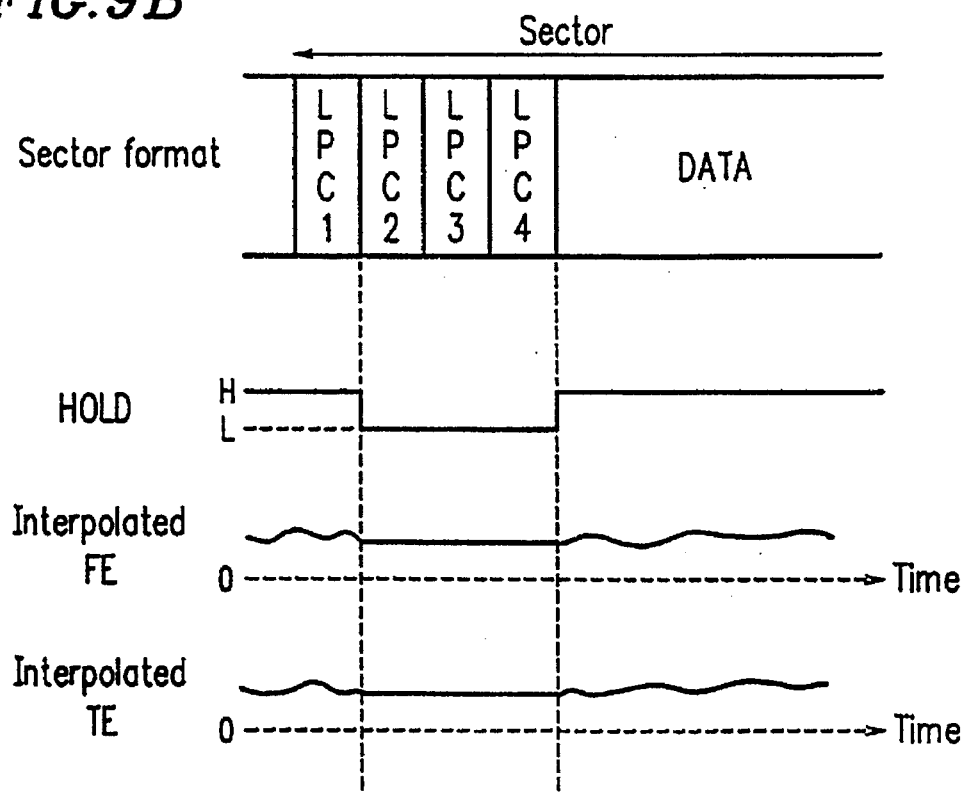
FIG. 9B is a diagram showing an interpolated focusing error signal and an interpolated tracking error signal in accordance with the laser power control method and apparatus of Example 2 of the present invention.

FIG. 9A is a diagram showing a focusing error signal and a tracking error signal in a conventional laser power control method and apparatus. FIG. 9B is a diagram showing an interpolated focusing error signal and an interpolated tracking error signal in accordance with the laser power control method and apparatus of Example 2 of the present invention.

In FIG. 9A, the focusing error signal FE and the tracking error signal TE take values which cannot be used for their respective feedback control processes (e.g., the zero level) while the laser element 101 is in the off-state (indicated as "Unusable Area" in FIG. 9A). Therefore, in a DATA area in which the laser element 101 is in the on-state, the values of the focusing error signal FE and the tracking error signal TE converge again through feedback control, but it may take some time before the control loops settle. Especially in the case where the focusing error signal FE and the tracking error signal TE are offset so as not to have zero as their respective values when the period LPC2 begins, as shown in FIG. 9A, a large disturbance is applied to the control loops for focusing control and tracking control when entering the DATA area. As a result, in the earlier portion of the DATA area, the focusing error signal FE and the tracking error signal TE can vary to a large extent, possibly exercising unfavorable influences on recording/reproducing operation.

According to Example 2 of the invention, the focusing error signal FE and the tracking error signal TE are sampled immediately before the off-state of the laser element 101 begins, and those values are held throughout the off-state period so as to be supplied to the respective control loops. Specifically, the above-mentioned sampling is conducted when a hold signal HOLD shown in FIG. 9B shifts from the H level to the L level, so that the sampled values are held during LPC2 to LPC4 so as to be fed to the focusing control loop and the tracking control loop. Thus, as exemplified by the interpolated focusing error signal and the interpolated tracking error signal shown in FIG. 9B, these signals do not largely vary when the DATA area begins.

Figure 10:
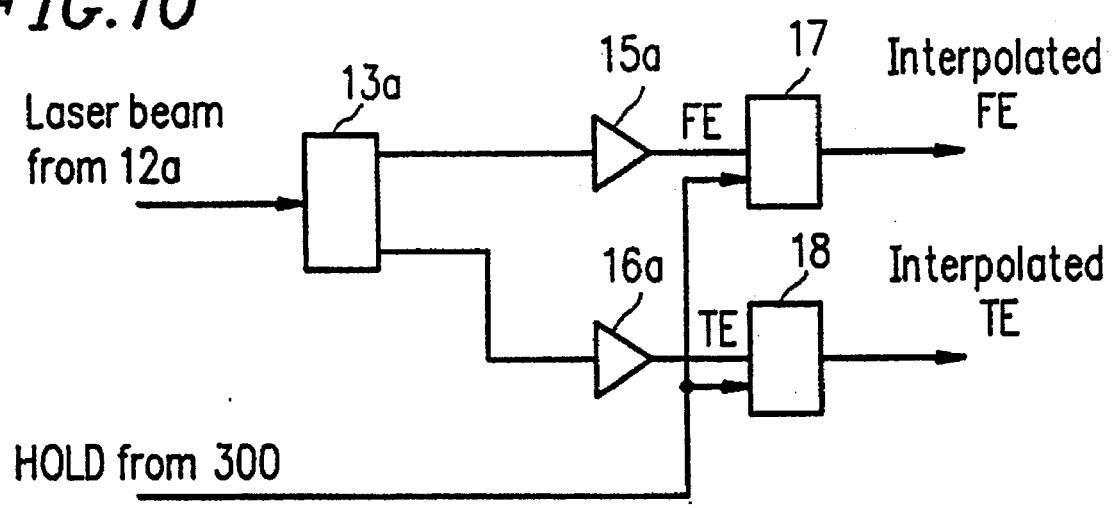
FIG. 10 is a block diagram showing a circuit to be further included in the configuration shown in FIG. 2 in order to realize the function described in FIG. 9B.

FIG. 10 is a block diagram showing a circuit to be further included in the configuration shown in FIG. 2 in order to realize the function described in FIG. 9B. Upon receiving a laser beam from the laser element 101, a photodetector 13a outputs the focusing error signal FE and the tracking error signal TE to amplifiers 15a and 16a, respectively, so as to be amplified thereby. The amplified focusing error signal FE and the tracking error signal TE are input to hold circuits 17 and 18, respectively. The hold circuits 17 and 18 output the interpolated focusing error signal FE and the interpolated tracking error signal TE (as held in the hold circuits 17 and 18) to a focusing actuator 200 and a tracking actuator 210 shown in FIG. 2. A hold control voltage HOLD for controlling the timing with which the hold circuits 17 and 18 holds their respective input signals is generated by the control voltage generator 300 shown in FIG. 4.

EXAMPLE 3

Figure 11:
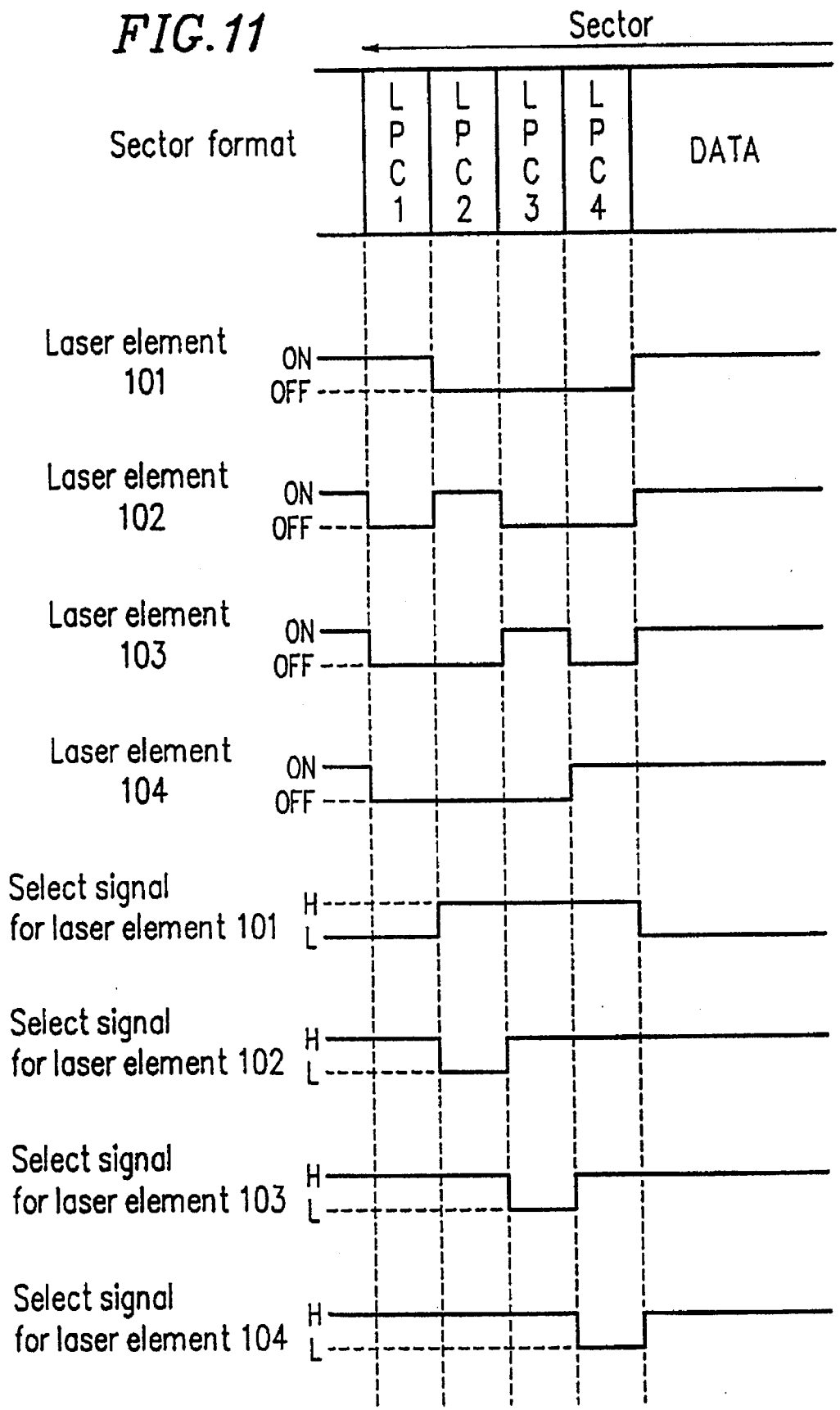
FIG. 11 is a diagram showing the states of laser elements and laser element select signals in accordance with the laser power control method and apparatus of Example 3 of the present invention.

FIG. 11 is a diagram showing the states of laser elements and laser element select signals in accordance with the laser power control method and apparatus of Example 3 of the present invention.

In Examples 1 and 2, focusing control and tracking control were made by only using a focusing error signal and a tracking error signal output from the photodetector 13a receiving a laser beam emitted from the laser element 101. In Example 3, focusing control and tracking control are made by selectively using respective focusing error signals and respective tracking error signals output from photodetectors 13a to 13d receiving the respective laser beams emitted from the laser elements 101 to 104. Specifically, a focusing error signal and a tracking error signal corresponding to the laser beam emitted by the laser element 101 are used in control areas LPC1 and data area DATA in FIG. 11, and focusing error signals and tracking error signals corresponding to the laser beams emitted by the laser elements 102 to 104 are respectively used in control areas LPC2 to LPC4 in FIG. 11, respectively, so as to perform the focusing control and the tracking control.

Figure 12:
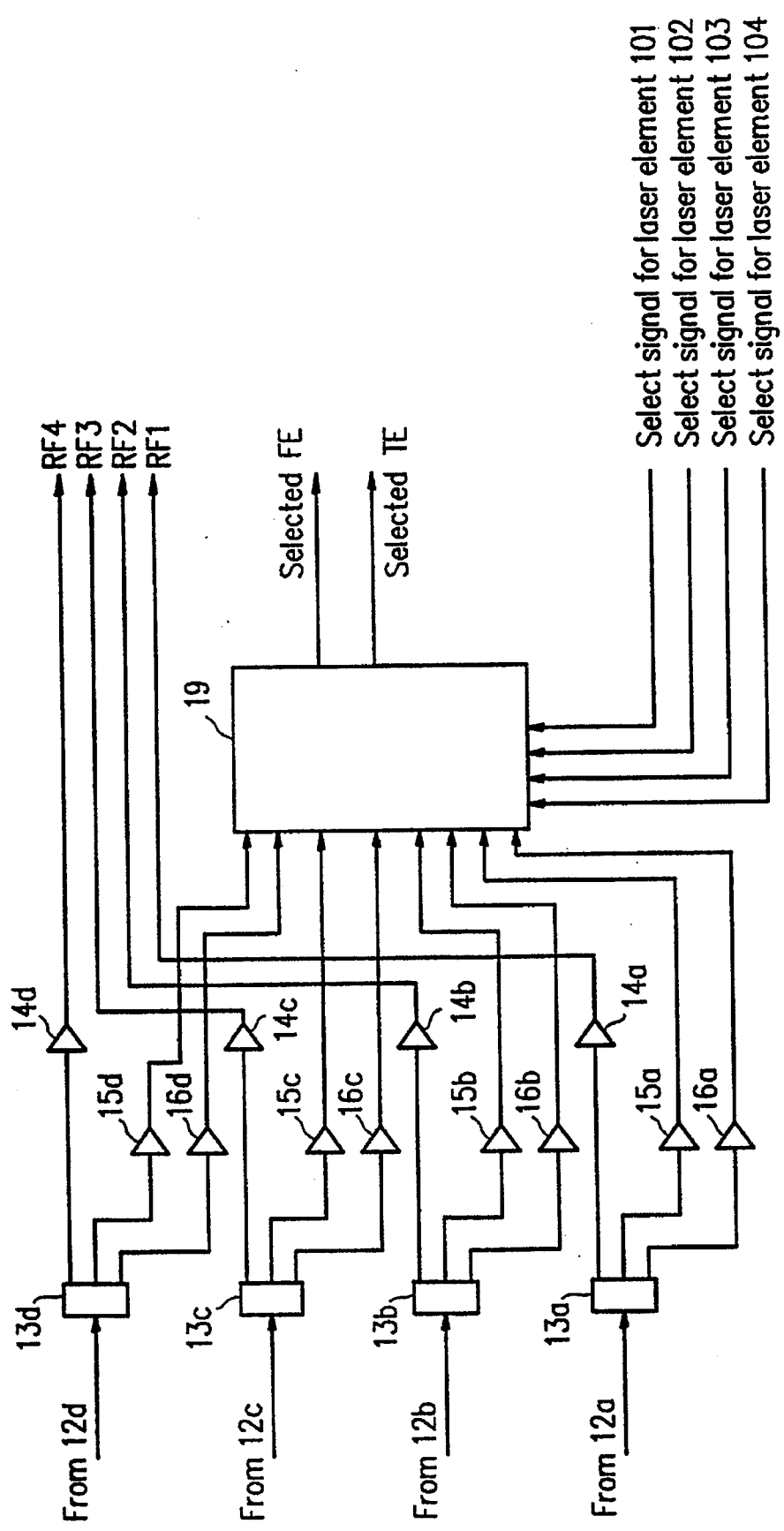
FIG. 12 is a block diagram showing a laser power control method and apparatus according to Example 3 of the present invention.

FIG. 12 is a block diagram showing a laser power control method and apparatus according to Example 3 of the present invention. The photodetectors 13a to 13d, which receive the laser beams emitted by the laser elements 101 to 104, respectively, each outputs a focusing error signal and a tracking error signal to a switching circuit 19. Similar to the amplifier 15a, amplifiers 15b to 15d amplify the focusing error signal FE output from the photodetectors 13b to 13d, respectively. Similar to the amplifier 16a, amplifiers 16b to 16d amplify the tracking error signal TE output from the photodetectors 13b to 13d, respectively. The switching circuit 19 receives select signals for the laser elements 101 to 104, and outputs, as the selected focusing error signal and the selected tracking error signal, the focusing error signal and the tracking error signal from the laser element that corresponds to a select signal which is at the L level. For example, when the select signal for the laser element 101 is at the L level, the focusing signal and the tracking signal output from the photodetector 13a are output by the switching circuit 19. The focusing error signal and the tracking error signal output from the switching circuit 19 are respectively input to the focusing actuator 200 and the tracking actuator 210 (shown in FIG. 2) so as to be used for the focusing control and the tracking control.

By generating select signals at the timing illustrated in FIG. 11 and performing focusing control and tracking control based thereupon, a focus error signal and a tracking error signal are always available (in other words, Toff=0), so that substantially no disturbance is applied to the focusing control and the tracking control.

Figure 13:
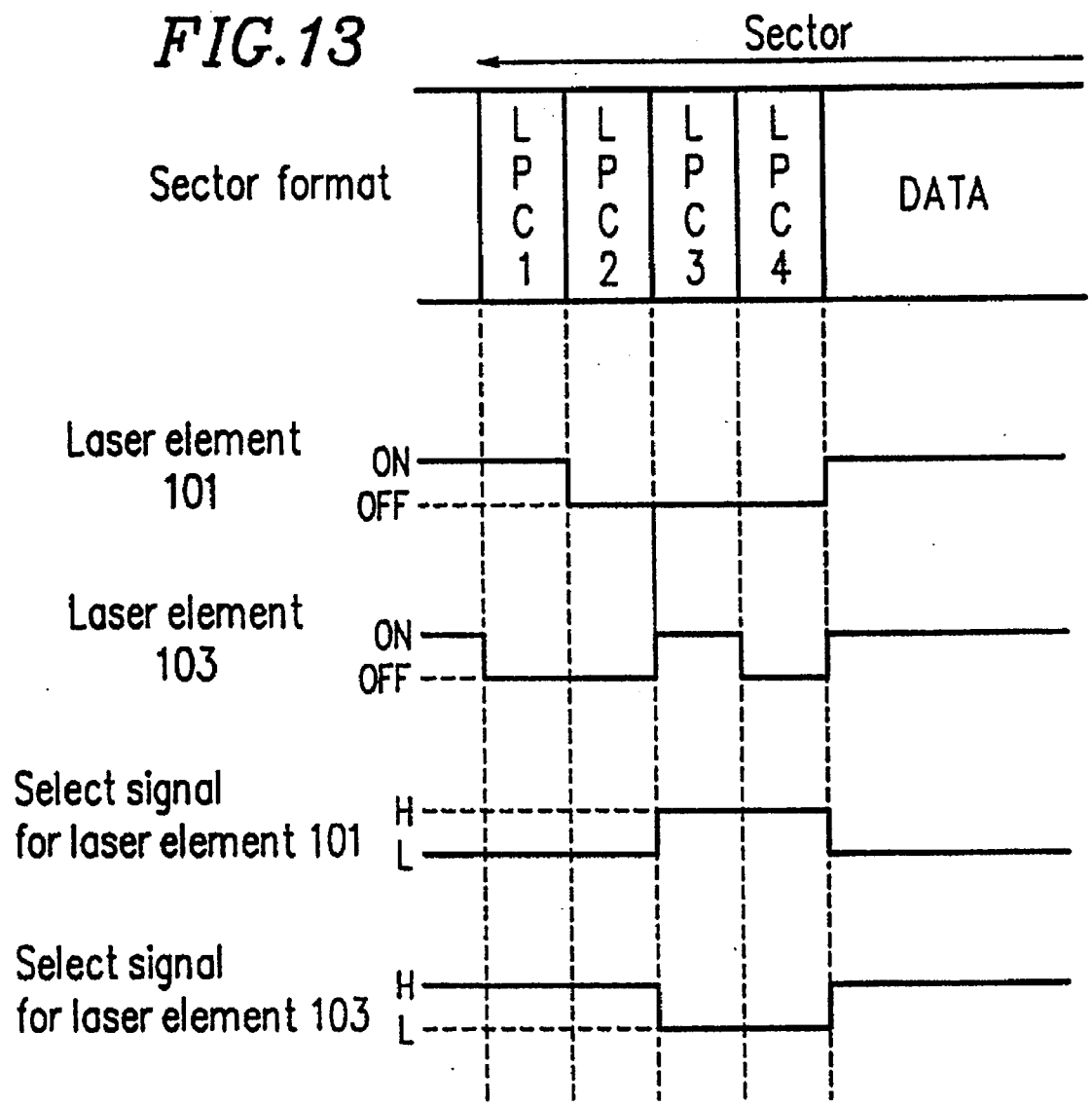
FIG. 13 is a timing diagram describing a variation of the method and apparatus of Example 3.

FIG. 13 is a timing diagram describing a variation of the method and apparatus of Example 3. A focusing error signal and a tracking error signal corresponding to the laser beam emitted from the laser element 101 are used in control areas LPC1 and LCP2 and an area DATA in FIG. 13, and a focusing error signal and a tracking error signal corresponding to the laser beam emitted by the laser element 103 are used in control areas LPC3 to LPC4 in FIG. 13, so as to perform the focusing control and the tracking control. As a result, appropriate focusing error signals or tracking signals cannot be obtained in control areas LPC2 and LPC4.

The focusing control will not receive substantial influences as long as Toff in control areas LPC2 and LPC4 satisfies Equation 1. As shown in Example 1, it is preferable that Toff also satisfies Equation 2.

In Example 3, the time period $T_{LPC}$ during which laser beams pass through each of control areas LPC2 to LPC4 is 9 μs. Since Toff (=$T_{LPC}$) is 9 μs, Tf is 20 μs, and Tt is 20 μs, both Equation 1 and Equation 2 are satisfied. Accordingly, both the focusing control system and the tracking control system will not receive substantial disturbance.

Figure 14:
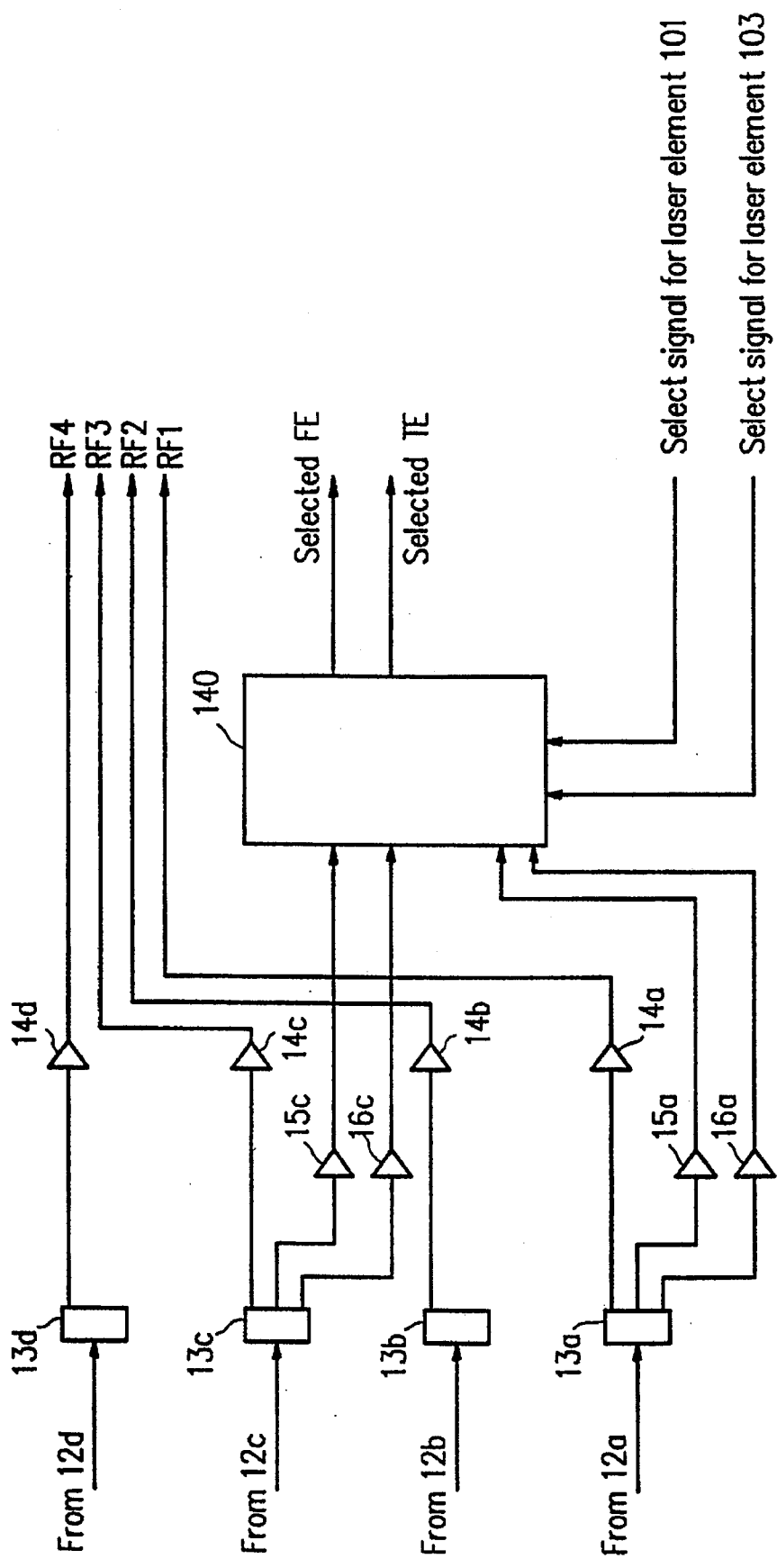
FIG. 14 is a block diagram showing a variation of the method and apparatus of Example 3 employing the timing diagram shown in FIG. 13.

FIG. 14 is a block diagram showing a variation of the method and apparatus of Example 3 employing the timing diagram shown in FIG. 13. A switching circuit 140 receives the focusing error signal and the tracking error signal from the photodetectors 13a and 13c, and outputs, as the selected focusing error signal and the selected tracking error signal, the focusing error signal and the tracking error signal output from one of the photodetectors 13a and 13c. The switching circuit 140 outputs the focusing error signal and the tracking error signal from the photodetector 13a when the select signal for the laser element 101 is at the L level, and outputs the focusing error signal and the tracking error signal from the photodetector 13c when the select signal for the laser element 103 is at the L level.

EXAMPLE 4

Figure 15:
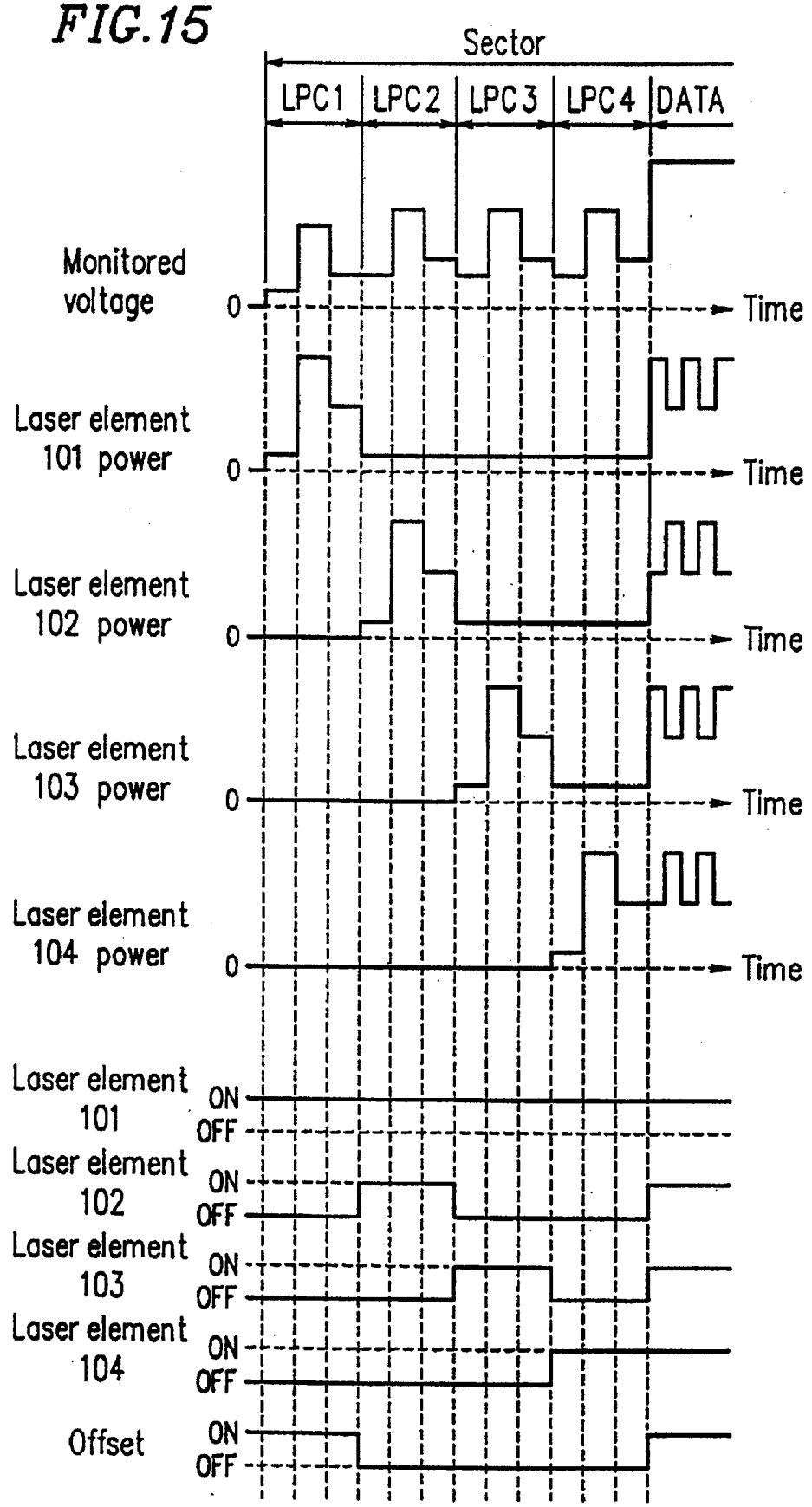
FIG. 15 is a timing diagram showing the states and the laser power of laser elements in accordance with the laser power control method and apparatus of Example 4 of the present invention.

FIG. 15 is a timing diagram showing the states and the laser power of laser elements in accordance with the laser power control method and apparatus of Example 4 of the present invention. The laser element 101 emits a laser beam at the read power while laser power control is performed for the laser elements 102 to 104. Therefore, a focusing error signal and a tracking signal are always available. No disturbance due to the off-states of a laser element used for the focusing control and tracking control is applied to the focusing control loop or the tracking control loop.

However, since the laser element 101 always emits a laser beam at the read power in control areas LPC1 to LPC4, the monitored voltages in LPC2 to LPC4 are shifted upward by a voltage corresponding to the read power of the laser element 101. Hereinafter, this voltage shift resulting from the laser beam emission at the read power will be referred to as an "offset voltage" for simplicity. In other words, the monitored voltage in control areas LPC2 is a sum of the monitored voltage corresponding to the laser beam emitted by the laser element 102 and the monitored voltage corresponding to the laser beam emitted by the laser element 101 at the read power (i.e., the offset voltage). The monitored voltages are biased in control areas LPC3 and LPC4 by the same offset voltage caused by the laser beam emission of the laser element 101 at the read power.

It becomes possible to perform accurate laser power control in control areas LPC2 to LPC4 as well as in LPC1 by cancelling this offset voltage. Specifically, the voltages of reference voltage sources for the laser elements 102 to 104 are increased by a voltage equivalent to the offset voltage in a period during which a signal OFFSET in FIG. 15 is at the L level. If the offset voltage is not cancelled in this manner, the laser power levels of the laser elements 102 to 104 are controlled so as to converge to laser power levels smaller than the values they should be set to.

Figure 16:
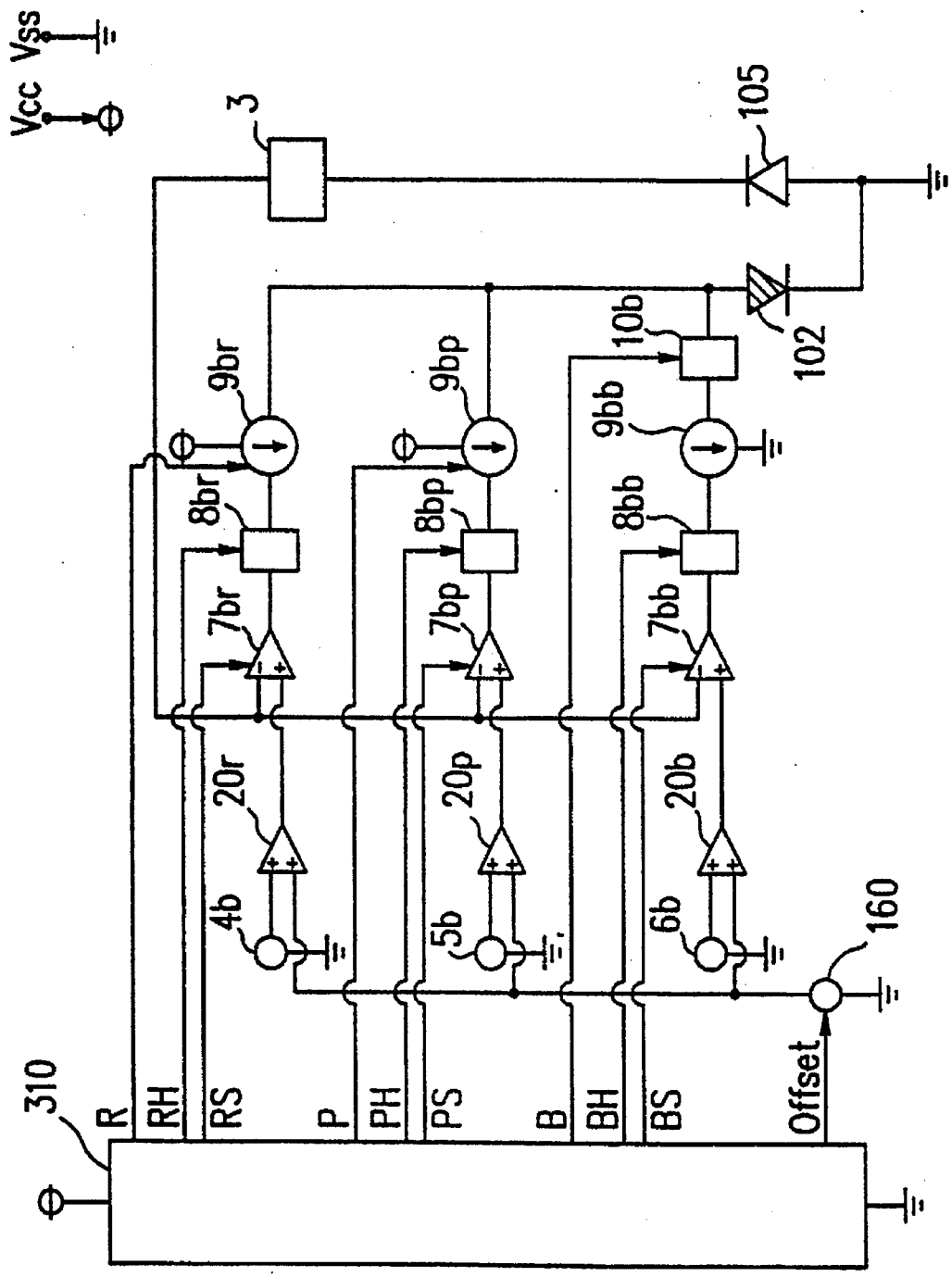
FIG. 16 is a circuit diagram showing the laser power control method and apparatus of Example 4 of the present invention.

FIG. 16 is a block diagram showing the laser power control method and apparatus of Example 4 of the present invention. FIG. 16 only illustrates the circuit for the laser element 102, with the circuits for the laser elements 101, 103 and 104 being omitted. The same circuit illustrated in FIG. 16 is provided for each of the laser elements 103 and 104. The circuit for the laser element 101 is similar to that shown in FIG. 5.

The circuit shown in FIG. 16 differs from the circuit shown in FIG. 5 in that adders 20r, 20p, and 20b for adding an offset voltage (i.e., a voltage output from a reference voltage source 160) to the voltages which were output from reference voltage sources 4b, 5b, and 6b (which correspond the read power, the peak power, and the bias power, respectively), respectively, are provided.

When OFFSET in FIG. 15 is at the L level, the adders 20r, 20p, and 20b add the voltage output from the reference voltage 160 to the voltages output from the reference voltage sources 4b, 5b, and 6b, respectively. The voltage output from the reference voltage source 160 is equivalent to the voltage output from the voltage source 4a in FIG. 5. Otherwise the circuit shown in FIG. 16 functions in the same manner as does the circuit shown in FIG. 5.

The control voltage generator 310 in FIG. 16 outputs the control voltages necessary for all the comparators, hold circuits, current sources, and switching circuits including the signal OFFSET.

Figure 17:
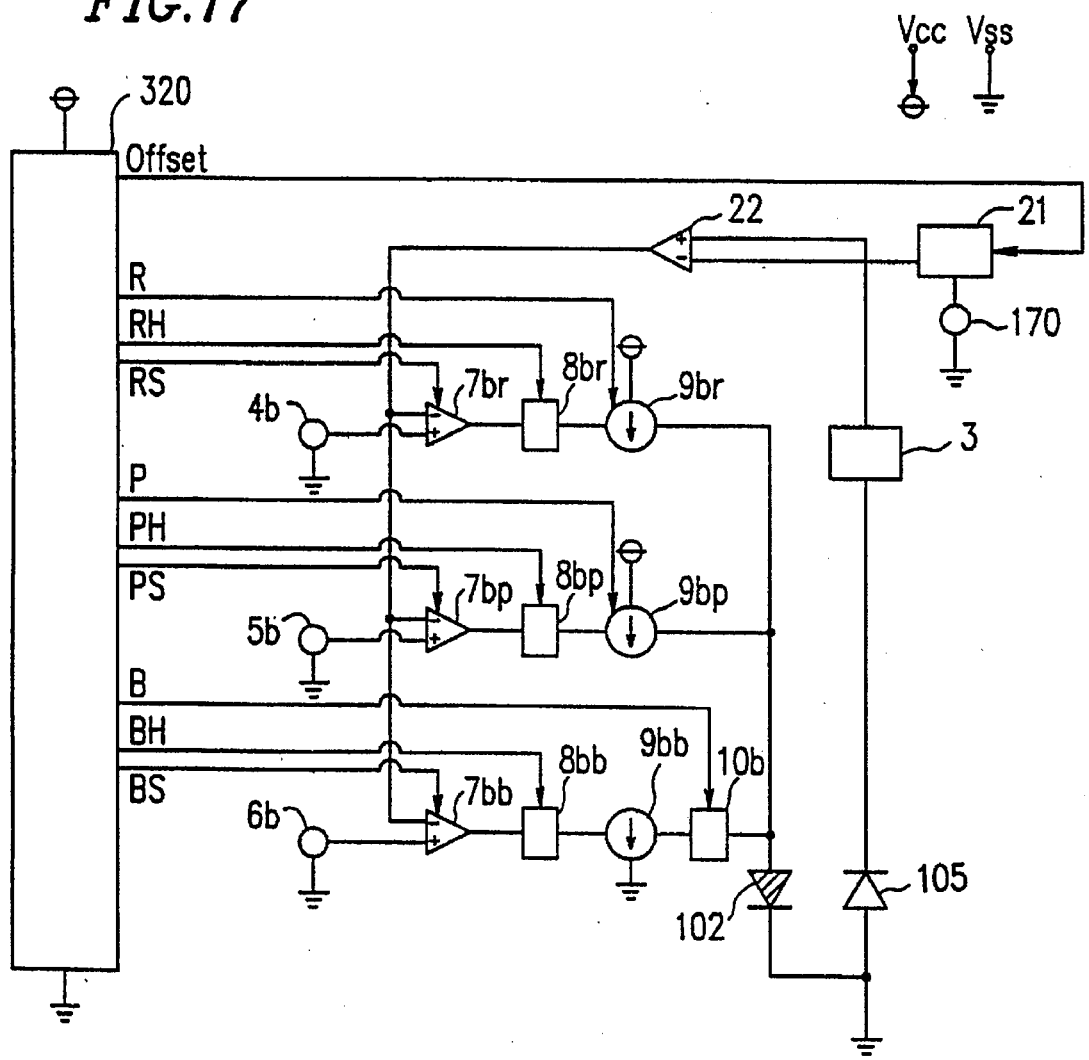
FIG. 17 is a circuit diagram showing a variation of the apparatus of Example 4 of the present invention.

FIG. 17 is a circuit diagram showing a variation of the apparatus of Example 4 of the present invention. FIG. 17 only illustrates the circuit for the laser element 102, with the circuits for the laser elements 101, 103 and 104 being omitted. The same circuit illustrated in FIG. 17 is provided for each of the laser elements 103 and 104. The circuit for the laser element 101 is similar to that shown in FIG. 5.

The circuit shown in FIG. 17 differs from the circuit shown in FIG. 5 in that a subtracter 21 for subtracting an offset voltage (i.e., a voltage output from a reference voltage source 170) from a voltage which was output from a current/voltage convertor 3 is provided.

When OFFSET in FIG. 15 is at the L level, the subtracter 21 subtracts the voltage output from the reference voltage 170 from the voltage output from the current/voltage convertor 3. The voltage output from the reference voltage source 170 is equivalent to the voltage output from the voltage source 4a in FIG. 5. Otherwise the circuit shown in FIG. 17 functions in the same manner as does the circuit shown in FIG. 5.

The control voltage generator 320 in FIG. 17 outputs the control voltages necessary for all the comparators, hold circuits, current sources, and switching circuits including the signal OFFSET.

According to Example 4, any laser element that is emitting a laser beam for the focusing control and the tracking control is always in the on-state. Therefore, no disturbance due to the off-states of a laser element used for the focusing control and tracking control is applied to the focusing control loop or the tracking control loop.

Although recording/reproduction is performed by varying the intensity of the laser beams emitted by laser elements in any of Examples 1 to 4 described above, the present invention is not limited in this regard. For example, it is possible to combine an element for emitting a laser beam at a constant level and an optical shutter element for modulating the laser beam emitted by that element.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for controlling intensities of a plurality of laser beams respectively emitted on a track of an optical disk by a plurality of laser diodes, the method comprising a step of:

performing focusing servo control for focusing one of the plurality of laser beams emitted by one of the plurality of laser diodes onto the track, and concurrently controlling an intensity of the laser beam emitted by each of the plurality of laser diodes to be within a predetermined range by comparing a signal which is in accordance with an intensity of the laser beam emitted by that laser diode with a reference signal, wherein a period during which the one of the plurality of laser diodes used for the focusing does not emit the one of the plurality of laser beams to provide for controlling of the intensities of the laser beams emitted by the other of the plurality of laser diodes is shorter than a response time of the focus servo control.

2. A method according to claim 1, wherein the track is divided into a plurality of sectors, and the intensity of the laser beam emitted by each of the plurality of laser diodes is controlled to be within the predetermined range once for every N sectors, N being a natural number.

3. A method according to claim 1, wherein the one of the plurality of laser diodes used for the focusing emits the laser beam over a period during which laser diodes other than the one laser diode used for the focusing are controlled.

4. A method for controlling intensities of a plurality of laser beams respectively emitted on a track of an optical disk by a plurality of laser diodes, the method comprising a step of:

performing focusing servo control for focusing one of the plurality of laser beams emitted by one of the plurality of laser diodes onto the track, and concurrently controlling an intensity of the laser beam emitted by each of the plurality of laser diodes to be within a predetermined range by comparing a signal which is in accordance with an intensity of the laser beam emitted by that laser diode with a reference signal, wherein a focusing error signal corresponding to the laser beam emitted by the one of the plurality of laser diodes used for the focusing is held over a period during which the one of the plurality of laser diodes used for the focusing does not emit the one of the plurality of laser beams to provide for controlling of the intensities of the laser beams emitted by the other of the plurality of laser diodes and wherein the period is shorter than a response time of the focus servo control.

5. A method for controlling intensities of a plurality of laser beams respectively emitted on a track of an optical disk by a plurality of laser diodes, the method comprising a step of:

performing focusing servo control for focusing one of the plurality of laser beams emitted by one of the plurality of laser diodes onto the track, and concurrently controlling an intensity of the laser beam emitted by each of the plurality of laser diodes to be within a predetermined range by comparing a signal which is in accordance with an intensity of the laser beam emitted by that laser diode with a reference signal, wherein a focusing error signal is selectively obtained from at least two of the plurality of laser diodes at respective times when the at least two of the plurality of laser diodes are emitting their respective laser beams in order that the intensities of their laser beams may be controlled.

6. A method for controlling intensities of a plurality of laser beams respectively emitted on a track of an optical disk by a plurality of laser diodes, the method comprising a step of:

performing focusing servo control for focusing one of the plurality of laser beams emitted by one of the plurality of laser diodes onto the track, and concurrently controlling an intensity of the laser beam emitted by each of the plurality of laser diodes to be within a predetermined range by comparing a signal which is in accordance with an intensity of the laser beam emitted by that laser diode with a reference signal, wherein the one of the plurality of laser diodes used for the focusing emits the laser beam while the laser beams emitted by laser diodes other than the one laser diode are being emitted in order to control their intensity.

7. An apparatus for controlling intensities of a plurality of laser beams respectively emitted on a track of an optical disk by a plurality of laser diodes, the apparatus comprising:

a focusing servo controller for focusing one of the plurality of laser beams emitted by one of the plurality of laser diodes onto the track;

a controller for controlling an intensity of the laser beam emitted by each of the plurality of laser diodes to be within a predetermined range by comparing a signal which is in accordance with an intensity of the laser beam emitted by that laser diode with a reference signal; and a section for setting a period during which the one of the plurality of laser diodes used for the focusing does not emit the one of the plurality of laser beams to provide for controlling of the intensities of the laser beams emitted by the other of the plurality of laser diodes to be shorter than a response time of the focus servo control.

8. An apparatus according to claim 7, wherein the track is divided into a plurality of sectors, and the intensity of the laser beam emitted by each of the plurality of laser diodes is controlled to be within the predetermined range once for every N sectors, N being a natural number.

9. An apparatus according to claim 7, wherein the one of the plurality of laser diodes used for the focusing emits the laser beam over a period during which laser diodes other than the one laser diode used for the focusing are controlled.

10. An apparatus for controlling intensities of a plurality of laser beams respectively emitted on a track of an optical disk by a plurality of laser diodes, the apparatus comprising:

a focusing servo controller for focusing one of the plurality of laser beams emitted by one of the plurality of laser diodes onto the track;

a controller for controlling an intensity of the laser beam emitted by each of the plurality of laser diodes to be within a predetermined range by comparing a signal which is in accordance with an intensity of the laser beam emitted by that laser diode with a reference signal; and a hold section for holding a focusing error signal corresponding to the laser beam emitted by the one of the plurality of laser diodes used for the focusing over a period during which the one of the plurality of laser diodes used for the focusing does not emit the one of the plurality of laser beams to provide for controlling of the intensities of the laser beams emitted by the other of the plurality of laser diodes and wherein the period is shorter than a response time of the focus servo control.

11. An apparatus for controlling intensities of a plurality of laser beams respectively emitted on a track of an optical disk by a plurality of laser diodes, the apparatus comprising:

a focusing servo controller for focusing one of the plurality of laser beams emitted by one of the plurality of laser diodes onto the track;

a controller for controlling an intensity of the laser beam emitted by each of the plurality of laser diodes to be within a predetermined range by comparing a signal which is in accordance with an intensity of the laser beam emitted by that laser diode with a reference signal; and a focusing section for performing the focusing by selectively obtaining a focusing error signal from at least two of the plurality of laser diodes at respective times when the at least two of the plurality of laser diodes are emitting their respective laser beams in order that the intensities of their laser beams may be controlled.

12. An apparatus for controlling intensities of a plurality of laser beams respectively emitted on a track of an optical disk by a plurality of laser diodes, the apparatus comprising:

a focusing servo controller for focusing one of the plurality of laser beams emitted by one of the plurality of the plurality of laser diodes onto the track;

a controller for controlling an intensity of the laser beam emitted by each of the plurality of laser diodes to be within a predetermined range by comparing a signal which is in accordance with an intensity of the laser beam emitted by that laser diode with a reference signal; and a section for controlling the one of the plurality of laser diodes used for the focusing to emit the laser beam while the laser beams emitted by laser diodes other than the one laser diode are being emitted in order to control their intensity.

* * * * *